United States Patent
Pisarenco et al.

(10) Patent No.: US 10,649,345 B2
(45) Date of Patent: May 12, 2020

(54) METHODS AND APPARATUSES FOR MEASUREMENT OF A PARAMETER OF A FEATURE FABRICATED ON A SUBSTRATE

(71) Applicant: ASML NETHERLANDS B.V., Veldhoven (NL)

(72) Inventors: Maxim Pisarenco, Son en Breugel (NL); Markus Gerardus Martinus Maria Van Kraaij, Eindhoven (NL); Sebastianus Adrianus Goorden, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 77 days.

(21) Appl. No.: 16/035,961

(22) Filed: Jul. 16, 2018

(65) Prior Publication Data
US 2019/0025714 A1    Jan. 24, 2019

(30) Foreign Application Priority Data

Jul. 18, 2017  (EP) .................................. 17181913
Jan. 26, 2018  (EP) .................................. 18153569

(51) Int. Cl.
*G06F 17/50*    (2006.01)
*G03F 7/20*    (2006.01)
(Continued)

(52) U.S. Cl.
CPC ..... *G03F 7/70633* (2013.01); *G01N 21/4788* (2013.01); *G01N 21/8806* (2013.01);
(Continued)

(58) Field of Classification Search
CPC .............. G03F 7/7065; G03F 7/70616; G03F 7/70625; G03F 7/70633; G03F 7/70641
(Continued)

(56) References Cited

U.S. PATENT DOCUMENTS

2006/0033921 A1   2/2006  Den Boef et al.
2010/0201963 A1   8/2010  Cramer et al.
(Continued)

FOREIGN PATENT DOCUMENTS

WO   2009/078708   6/2009
WO   2009/106279   9/2009
WO   2015/078670   6/2015

OTHER PUBLICATIONS

European Search Report issued in corresponding European Application No. 17181913, dated Dec. 20, 2017, 2 pages.
(Continued)

*Primary Examiner* — Paul Dinh
(74) *Attorney, Agent, or Firm* — Pillsbury Winthrop Shaw Pittman LLP

(57) ABSTRACT

Methods and apparatuses for estimation of at least one parameter of interest of a feature fabricated on a substrate, the feature having a plurality of structure parameters, the structure parameters including the at least one parameter of interest and one or more nuisance parameters. A receiver receives radiation scattered from one or more measured features on the substrate. A pupil generator generates an unprocessed pupil representation of the received radiation. A matrix multiplier multiplies a transformation matrix with intensities of each of a plurality of pixels of the unprocessed pupil representation to determine a post-processed pupil representation in which effects of the one or more nuisance parameters are mitigated or removed. A parameter estimator estimates the at least one parameter of interest based on the post-processed pupil representation.

20 Claims, 8 Drawing Sheets

(51) Int. Cl.
    *G01N 21/47*     (2006.01)
    *G01N 21/88*     (2006.01)
    *G01N 21/956*    (2006.01)
(52) U.S. Cl.
    CPC ...... *G03F 7/70616* (2013.01); *G03F 7/70625* (2013.01); *G03F 7/70641* (2013.01); *G01N 21/956* (2013.01); *G01N 2021/8883* (2013.01); *G03F 7/70341* (2013.01)
(58) Field of Classification Search
    USPC .......................................................... 716/54
    See application file for complete search history.

(56)          References Cited

U.S. PATENT DOCUMENTS

| 2011/0027704 | A1  | 2/2011  | Cramer et al. |
| 2011/0043791 | A1  | 2/2011  | Smilde et al. |
| 2011/0199596 | A1  | 8/2011  | Middlebrooks |
| 2011/0231167 | A1  | 9/2011  | Cramer et al. |
| 2012/0242970 | A1  | 9/2012  | Smilde et al. |
| 2014/0358488 | A1  | 12/2014 | Lee et al. |
| 2016/0334716 | A1* | 11/2016 | Mieher ............... G03F 7/70641 |
| 2017/0255112 | A1* | 9/2017  | Van Leest .......... G01N 21/9501 |

OTHER PUBLICATIONS

Taiwanese office Action issued in corresponding Taiwanese Patent Application No. 107124567, dated Jun. 21, 2019.

* cited by examiner

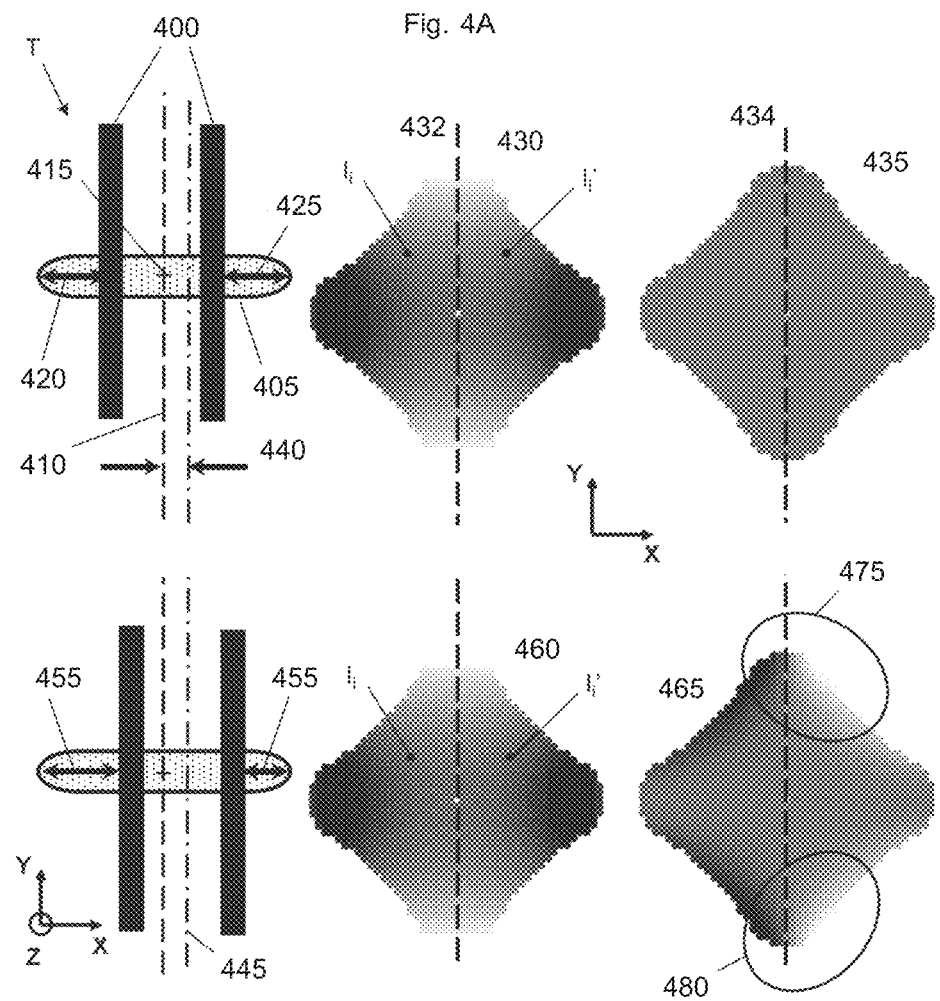
Fig. 4A
Fig. 4B
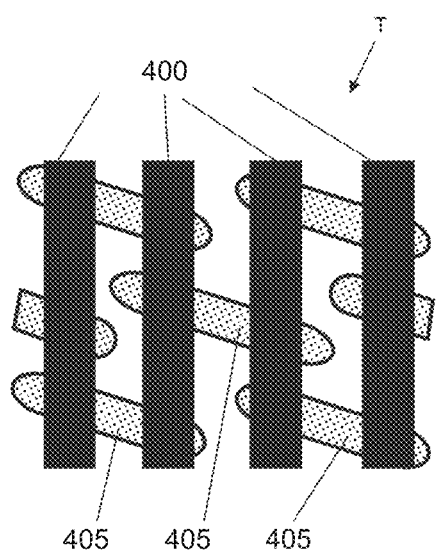
Fig. 4C

METHODS AND APPARATUSES FOR MEASUREMENT OF A PARAMETER OF A FEATURE FABRICATED ON A SUBSTRATE

This application claims the benefit of priority of European patent application no. 17181913, filed Jul. 18, 2017, and of European patent application no. 18153569, filed Jan. 26, 2018. Each of the foregoing applications is incorporated herein in its entirety by reference.

TECHNICAL FIELD

This description relates to methods and apparatuses for estimating a parameter of interest, such as overlay, of a feature, such as a semiconductor device structure, fabricated on a substrate such as a semiconductor substrate.

BACKGROUND

A lithographic apparatus is a machine that applies a desired pattern onto a substrate, usually onto a target portion of the substrate. A lithographic apparatus can be used, for example, in the manufacture of integrated circuits (ICs) or other devices. In that instance, a patterning device, which is alternatively referred to as a mask or a reticle, may be used to generate a circuit pattern to be formed on an individual layer of the device. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate.

In general, a single substrate will contain a network of features that may be adjacent target portions that are successively patterned. Known lithographic apparatus include so-called steppers, in which each target portion is irradiated by exposing a pattern onto the target portion at one time, and so-called scanners, in which each target portion is irradiated by scanning the pattern through a radiation beam in a given direction (the "scanning"-direction) while synchronously scanning the substrate parallel or transverse to this direction.

It is also possible to transfer the pattern from the patterning device to the substrate by imprinting the pattern onto the substrate.

Manufacturing devices, such as semiconductor devices, typically involves processing a substrate (e.g., a semiconductor wafer) using a number of fabrication processes to form various features and often multiple layers of the devices. Such layers and/or features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process.

A patterning process involves a pattern transfer step, such as optical and/or nano-imprint lithography using a lithographic apparatus, to provide a pattern on a substrate and typically, but optionally, involves one or more related pattern processing steps, such as resist development by a development apparatus, baking of the substrate using a bake tool, etching the pattern by an etch apparatus, etc. Further, one or more metrology processes are involved in the patterning process.

Metrology processes are used at various steps during a patterning process to monitor and/or control the process. For example, metrology processes are used to measure one or more characteristics (or parameters) of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), one or more variables of the patterning process may be redesigned or altered, e.g., based on the measurements of the one or more characteristics, such that substrates manufactured by the patterning process have acceptable characteristics.

With the advancement of lithography and other patterning process technologies, the dimensions of functional elements of devices have been reduced while the amount of the functional elements per device has increased. The requirement of accuracy in terms of overlay, CD etc. has become more and more stringent. Error will inevitably be produced in the patterning process. The error may cause a problem in terms of the functioning of the device, including failure of the device to function or one or more electrical problems of the functioning device. Accordingly, it is desirable to be able to characterize one or more of these errors and take steps to design, modify, control, etc. a patterning process to reduce or minimize one or more of these errors.

For example, accurate and robust overlay measurements are a significant factor in improving the yield of devices for a given substrate. In known methods for overlay measurement, targets in the form of, e.g., periodic gratings are placed at different positions on a substrate, such as a semiconductor wafer. The targets are illuminated by radiation, which radiation is scattered by the target and received by a detector and a pupil is produced. Analysis of the intensity of pixels of the pupil provides an estimation of the overlay imparted when the targets were fabricated. This estimation of overlay may be transposed across the remainder of the substrate.

Several approaches for overlay metrology are known and some are briefly described below:

In diffraction-based overlay (DBO) the overlay is extracted from the asymmetry of the ±1st orders of radiation scattered off of a metrology target. The illumination spot formed by the radiation beam under-fills the target and the measurement is performed in the Fourier (or pupil) plane.

In diffraction-based overlay on small targets (μDBO) the overlay is again extracted from the asymmetry of the ±1st orders of a radiation scattered off of a metrology target. The illumination spot formed by the radiation beam over-fills the target and the measurement is performed in the image plane. The image plane is chosen (instead of the Fourier plane) in order to facilitate the removal of target edge effects.

SUMMARY

A further approach for overlay metrology is called at-resolution overlay (ARO). This is a new technique developed for overlay measurement directly on, e.g., device structures of, e.g., a semiconductor substrate. Current methods use 0th order scattered radiation from such structures and overlay is extracted from asymmetries present in the 0th order measured radiation. In an example, an illumination spot formed by the radiation beam under-fills the periodic structure and the measurement is performed in the Fourier plane. At-resolution overlay is explained in more detail in the detailed description and reference can be made to those sections herein.

Advantages of at-resolution overlay have been rapidly recognized. The possibility of measuring overlay "on product" using the device structure itself has opened the way for optical metrology tools to compete with non-optical approaches such as electron microscope (SEM) based overlay measurements, which are destructive in nature. Next to all the advantages of optical metrology employed in at-resolution overlay (e.g. measurement speed), there may be one or more potential problems, some of which are mentioned below:

At-resolution overlay deals with structures that possess some symmetry (for example x-symmetry, y-symmetry or point symmetry). Symmetry is used in order to define a differential pupil, which is explained in more detail below.

At-resolution overlay measurements may suffer from cross-talk to one or more other parameters of the structures to be measured. These one or more nuisance parameters do not relate to the parameter of interest (in this case overlay) but have an impact on the intensity of pixels in the pupil and differential pupil making it difficult to isolite the effect based on the parameter of interest.

At-resolution overlay measurements may be sensitive to the choice of nominal configuration due to nonlinear effects. A nominal configuration in this context encompasses a feature model, which is an estimate of the true feature (or stack) on the substrate.

According to an aspect, there is provided an apparatus for estimation of at least one parameter of interest of a feature fabricated on a substrate, the feature comprising a plurality of structure parameters, the structure parameters comprising the at least one parameter of interest and one or more nuisance parameters, the apparatus comprising: a receiver configured to receive radiation scattered from one or more measured features on the substrate; a pupil generator configured to generate an unprocessed pupil representation of the received radiation, the unprocessed pupil representation comprising a plurality of pixels each having an intensity indicative of the at least one parameter of interest and the one or more nuisance parameters; a matrix multiplier for multiplying the transformation matrix with the intensities of each of the plurality pf pixels of the unprocessed pupil representation to determine a post-processed pupil representation in which the effects of the one or more nuisance parameters are mitigated or removed; and a parameter estimator configured to estimate the at least one parameter of interest based on the post-processed pupil representation.

The term "scattered" as used herein encompasses radiation which, after interaction with the substrate, goes towards a detector. This radiation may be reflected or diffracted. Scattered radiation may comprise $0^{th}$ order (i.e. the angle is the same as the incidence angle, which may be termed "reflected") and $1^{st}$ (or higher) order angles, which will "reflect" at a different angle than incoming radiation.

Optionally, the at least one parameter of interest comprises overlay between at least two elements of the one or more measured features on the substrate, in at least one axis.

Optionally, the apparatus further comprises a transformation matrix generator configured to generate a transformation matrix based on one or more of the nuisance parameters.

Optionally, the apparatus further comprises a nuisance matrix generator configured to generate a nuisance matrix comprising one or more elements corresponding to one or more nuisance parameters, wherein the transformation matrix is generated based on the nuisance matrix.

Optionally, the nuisance matrix generator is configured to determine elements of the nuisance matrix based on one or more terms of a mathematical representation of a function describing the unprocessed pupil representation, and wherein the mathematical representation separates at least one nuisance parameters from the at least one parameter of interest.

Optionally, the function describing the unprocessed pupil representation is I'(p+s), and wherein: p is a vector of the plurality of structure parameters of a feature model corresponding to the one or more measured features; s is a vector of differences in the vector of parameters between the feature model and the one or more measured features; and I' is the unprocessed pupil representation.

Optionally, the nuisance matrix comprises terms of the mathematical representation corresponding to one or more of the separated nuisance parameters.

Optionally, the mathematical representation comprises a Taylor series expansion of the function describing the unprocessed pupil representation.

Optionally, the nuisance matrix generator is configured to determine one or more of the elements of the nuisance matrix to be one or more derivative parts of one of one or more terms of the Taylor series expansion.

Optionally, the transformation matrix generator is configured to generate a transformation matrix that produces a non-zero result when multiplied by a term of the function describing the unprocessed pupil representation of the feature.

Optionally, the transformation matrix generator is configured to generate the transformation matrix that increases a ratio between a proportion of the intensity of the post-processed pupil representation caused by the at least one parameter of interest and a proportion of the intensity of the post-processed pupil representation caused by the one or more nuisance parameters relating to the elements of the nuisance matrix when multiplied with the intensities of the plurality of pixels of the unprocessed pupil representation.

Optionally, the transformation matrix generator is configured to generate the transformation matrix that maximizes a ratio between a proportion of the intensity of the post-processed pupil representation caused by the at least one parameter of interest and a proportion of the intensity of the post-processed pupil representation caused by the one or more nuisance parameters relating to the elements of the nuisance matrix.

Optionally, the apparatus further comprises a transformation matrix generator configured to generate a transformation matrix based on a plurality of unprocessed pupil representations of a plurality of further features fabricated on the substrate.

Optionally, the plurality of further features fabricated on the substrate exhibit structure parameters resulting in pupil representations that are orthogonal to the transformation matrix.

Optionally, the exhibited structure parameters comprise randomly varying nuisance parameters and/or a variation in the parameter of interest that is less than a threshold value.

Optionally, the apparatus further comprises a measurement matrix generator configured to generate a measurement matrix comprising one or more of the plurality of unprocessed pupil representations of the plurality of further features fabricated on the substrate.

Optionally, prior to generating the measurement matrix, the measurement matrix generator is configured to remove an average unprocessed pupil representation from one or more of the unprocessed pupil representations of the plurality of further features fabricated on the substrate.

Optionally, the transformation matrix generator is configured to generate the transformation matrix by decomposing the nuisance matrix or measurement matrix into a singular value decomposition, $USV^H$, thereof, such that $WD=WUSV^H=W\Sigma_{k=1}^{np}s_k u_k v_k^H$ where np is a number of columns of the nuisance matrix or measurement matrix, and wherein the transformation matrix generator is configured to generate at least part of the transformation matrix based on a plurality of elements of the matrix U that are orthogonal to $u_k$ for k=1 to np.

Optionally, the transformation matrix generator is configured to generate the transformation matrix by undertaking a conjugate transpose of a plurality of elements of the matrix U that are orthogonal to $u_k$ for k=1 to np.

Optionally, the transformation matrix generator is configured to generate the transformation matrix that reduces a proportion of the intensity of the post-processed pupil representation caused by the one or more nuisance parameters.

Optionally, the proportion of the intensity of the post-processed pupil representation caused by the nuisance parameters is reduced by greater than 50%, by greater than 80%, or by 100%.

According to an aspect, there is provided an inspection apparatus comprising any apparatus disclosed herein, particularly those above, and further comprising a radiation source for irradiating the one or more features.

Optionally, the inspection apparatus is a metrology apparatus.

According to an aspect, there is provided a method for estimation of at least one parameter of interest of a feature fabricated on a substrate, the feature comprising a plurality of structure parameters, the structure parameters comprising the at least one parameter of interest and one or more nuisance parameters, the method comprising: receiving, by a receiver, radiation scattered from one or more measured features on the substrate; generating, by a pupil generator, an unprocessed pupil representation based on the received radiation, the unprocessed pupil representation comprising a plurality of pixels each having an intensity indicative of the at least one parameter of interest and the one or more nuisance parameters; multiplying, by a matrix multiplier, a transformation matrix with the intensities of each of the plurality of pixels of the unprocessed pupil representation to determine a post-processed pupil representation in which the effects of the one or more nuisance parameters are mitigated; and estimating, by a parameter estimator, the at least one parameter of interest based on the post-processed pupil representation.

Optionally, the at least one parameter of interest comprises overlay between at least two elements of the one or more measured features on the substrate, in at least one axis.

Optionally, the method further comprises generating, by a transformation matrix generator, a transformation matrix based on one or more of the nuisance parameters.

Optionally, the method further comprises generating, by a nuisance matrix generator, a nuisance matrix comprising one or more elements corresponding to one or more nuisance parameters, wherein the transformation matrix is generated based on the nuisance matrix.

Optionally, the nuisance matrix generator determines elements of the nuisance matrix based on one or more terms of a mathematical representation of a function describing the unprocessed pupil representation, and wherein the mathematical representation separates at least one nuisance parameter from the at least one parameter of interest.

Optionally, the method further comprises generating, by a transformation matrix generator, a transformation matrix based on a plurality of unprocessed pupil representations of a plurality of further features fabricated on the substrate.

Optionally, the method further comprises generating, by a measurement matrix generator, a measurement matrix comprising one or more of the plurality of unprocessed pupil representations of the plurality of further features fabricated on the substrate.

Optionally, prior to generating the measurement matrix, the measurement matrix generator removes an average unprocessed pupil representation from one or more of the unprocessed pupil representations of the plurality of further features fabricated on the substrate.

Optionally, the function describing the unprocessed pupil representation is I'(p+s), and wherein: p is a vector of the plurality of structure parameters of a feature model corresponding to the one or more measured features; s is a vector of differences in the vector of parameters between the feature model and the one or more measured features; and I' is the unprocessed pupil representation.

Optionally, the nuisance matrix comprises terms of the mathematical representation corresponding to one or more separated nuisance parameters.

Optionally, the mathematical representation comprises a Taylor series expansion of the function describing the unprocessed pupil representation.

Optionally, the nuisance matrix generator determines one or more of the elements of the nuisance matrix to be one or more derivative parts of one of one or more terms of the Taylor series expansion.

Optionally, the transformation matrix generator generates the transformation matrix by decomposing the nuisance matrix or measurement matrix into a singular value decomposition, $USV^H$, thereof, such that $WD=WUSV^H=W\Sigma_{k=1}^{np}s_k u_k v_k^H$ where np is a number of columns of the nuisance matrix or measurement matrix, and wherein the transformation matrix generator generates at least part of the transformation matrix based on a plurality of elements of the matrix U that are orthogonal to $u_k$ for k=1 to np.

Optionally, the transformation matrix generator generates the transformation matrix by undertaking a conjugate transpose of a plurality of elements of the matrix U that are orthogonal to $u_k$ for k=1 to np.

Optionally, the transformation matrix generator generates a transformation matrix that reduces a proportion of the intensity of the post-processed pupil representation caused by one or more nuisance parameters.

Optionally, the proportion of the intensity of the post-processed pupil representation caused by the one or more nuisance parameters is reduced by greater than 50%, or by greater than 80%, or by 100%.

Optionally, the transformation matrix generator generates a transformation matrix that produces a non-zero result when multiplied by a term of the function describing the unprocessed pupil representation corresponding to the at least one parameter of interest.

Optionally, the transformation matrix generator generates the transformation matrix that increases a ratio between a proportion of the intensity of the post-processed pupil representation caused by the at least one parameter of interest and a proportion of the intensity of the post-processed pupil representation caused by the one or more nuisance parameters relating to the elements of the nuisance matrix when multiplied with the intensities of the plurality of pixels of the unprocessed pupil representation.

Optionally, the transformation matrix generates the transformation matrix that maximizes a ratio between the proportion of the intensity of the post-processed pupil representation caused by the at least one parameter of interest and a proportion of the intensity of the post-processed pupil representation caused by the one or more nuisance parameters relating to the elements of the nuisance matrix.

According to an aspect, there is provided a computer program comprising instructions which, when executed on at least one processor, cause the at least one processor to control an apparatus to carry out any method described herein, particularly those above.

According to an aspect, there is provided a carrier containing the computer program above, wherein the carrier is one of an electronic signal, an optical signal, a radio signal, or a non-transitory computer readable storage medium.

BRIEF DESCRIPTION OF THE DRAWINGS

Exemplary embodiments are described herein with reference to the accompanying drawings, in which:

FIGS. 4A and 4B show unit cells of a feature and corresponding unprocessed and processed (i.e. differential) pupil representations and FIG. 4C shows a further example of a unit cell of a feature;

DETAILED DESCRIPTION

Recently, new techniques developed for overlay measurement do not require the use of an overlay target, but measure overlay directly on device structures. Typically, these are periodic structures and the overlay is extracted from asymmetries in the pupil of, e.g., an angle resolved scatterometer or asymmetries in the spectrum, as a function of the wavelength, of a spectroscopic ellipsometer. Methods for determining overlay directly from device structures are more easily implemented on periodic device structures, such as memory, where the periodicity of the device structure allows the use of such methods to determine overlay. However, it would be advantageous to be able to estimate overlay directly using, e.g., logic device structures, which have little or no periodicity. In addition or alternatively, techniques to remove one or more nuisance parameters from estimations of overlay may be of benefit when estimating overlay using periodic structures, whether the target is part of a device structure or a specific target, such as an overlay target.

It is noted that the methods and apparatuses disclosed herein may be used to estimate one or more other parameters of interest in addition to or other than overlay such as side wall angle (SWA), tilt in vertical direction, bottom floor tilt, critical dimension (CD), focus of a lithographic apparatus, grating/feature height, layer thickness, refractive index of a material, etc.

Generally, disclosed herein are methods and apparatuses for mathematical generalization of the methods for use in at-resolution overlay to allow estimation of overlay from non-periodic structures, such as device structures.

Exemplary methods and apparatuses disclosed herein determine a mathematical expansion of a function representing measured pixel intensities in a pupil representation, such that one or more nuisance terms are separated from one or more parameters related to overlay (or some other or additional parameter of interest). In the examples given below, a Taylor series expansion is used, but other mathematical expansions may be used. A transformation function (or matrix) can then be determined which reduces or makes zero the magnitude of one or more nuisance terms (containing one or more nuisance parameters). When the transformation matrix is multiplied by the intensities of pixels in the measured pupil representation to produce a post-processed pupil representation, the resulting intensities of pixels of the pot-processed pupil representation may be used to estimate overlay (or other or additional parameter of interest).

Figure 1:
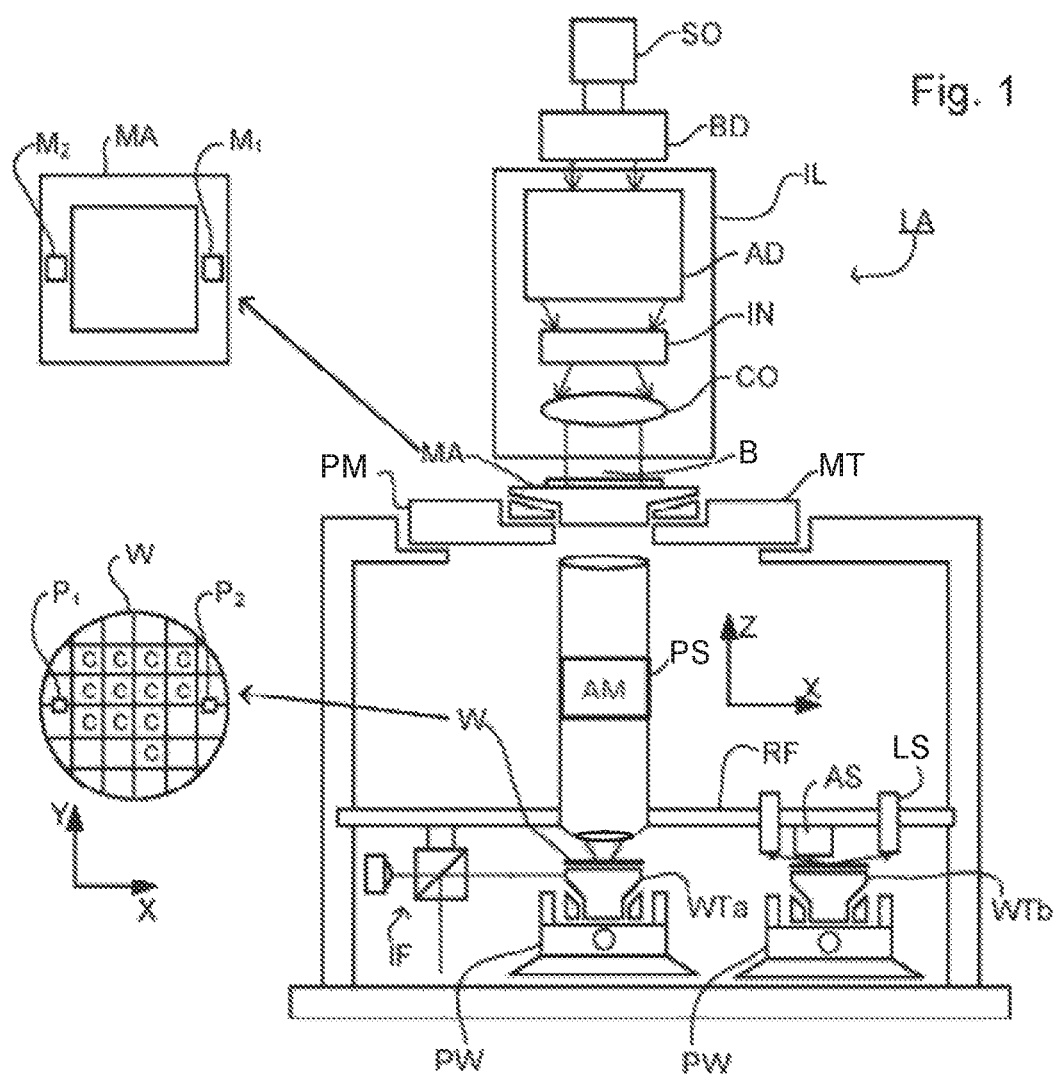
FIG. 1 is a schematic representation of a lithographic apparatus.

FIG. 1 schematically depicts a lithographic apparatus LA. The apparatus comprises:
  an illumination system (illuminator) IL configured to condition a radiation beam B (e.g. UV radiation or DUV radiation);
  a support structure (e.g. a mask table) MT constructed to support a patterning device (e.g. a mask) MA and connected to a first positioner PM configured to accurately position the patterning device in accordance with certain parameters;
  a substrate table (e.g. a wafer table) WTa, WTb constructed to hold a substrate (e.g. a resist-coated wafer) W and connected to a second positioner PW configured to position the substrate accurately in accordance with certain parameters; and
  a projection system (e.g. a refractive projection lens system) PS configured to project a pattern imparted to the radiation beam B by patterning device MA onto a target portion C (e.g. comprising one or more dies) of the substrate W, the projection system supported on a reference frame (RF).

The illumination system may include various types of optical components, such as refractive, reflective, magnetic, electromagnetic, electrostatic or other types of optical components, or any combination thereof, for directing, shaping, or controlling radiation.

The support structure supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable Liquid Crystal Display (LCD) panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The exemplary apparatus shown in FIG. 1 is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to position the patterning device MA accurately with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
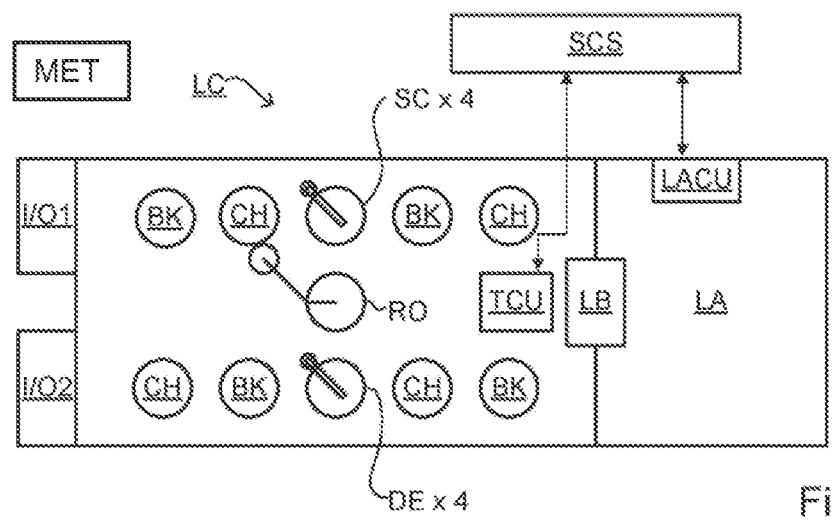
FIG. 2 is a schematic representation of a lithographic cell.

As shown in FIG. 2, the lithographic apparatus LA may form part of a lithographic cell LC, also sometimes referred to a lithocell or cluster, which also includes apparatuses to perform pre-exposure and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently, it is desirable to inspect an exposed substrate to measure or determine one or more parameters of interest, such as overlay (which can be, for example, between structures in overlying layers or between structures in a same layer that have been provided separately to the layer by, for example, a double patterning process), line thickness, critical dimension (CD), focus offset, a material property, etc. Accordingly a manufacturing facility in which lithocell LC is located also typically includes a metrology system MET including an inspection or metrology apparatus and which receives some or all of the substrates W that have been processed in the lithocell. The metrology system MET may be part of the lithocell LC, for example it may be part of the lithographic apparatus LA.

Metrology results may be provided directly or indirectly to a supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more parameters of the one or more features fabricated on the substrate, and in particular, how one or more parameters of different substrates vary or parameters of different layers of the same substrate vary from layer to layer. The metrology apparatus may be integrated into the lithographic apparatus LA or the lithocell LC or may be a stand-alone device. To enable rapid measurement, it is desirable that the metrology apparatus measure one or more parameters in the exposed resist layer immediately after the exposure. However, the latent image in the resist has a low contrast—there is only a very small difference in refractive index between the parts of the resist which have been exposed to radiation and those which have not—and not all metrology apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of a faulty substrate but may still provide useful information.

To enable the metrology, one or more targets can be provided on the substrate. In exemplary arrangements, the target is specially designed and may comprise a periodic structure. In exemplary arrangements, the target is a part of a device pattern, e.g., a periodic structure of the device pattern. In exemplary arrangements, the device pattern is a periodic structure of a memory device (e.g., a Bipolar Transistor (BPT), a Bit Line Contact (BLC), etc. structure).

In exemplary arrangements, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

In exemplary arrangements, one of the parameters of interest of a patterning process is overlay. Overlay can be measured using dark field scatterometry in which the 0th order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

Figure 3:
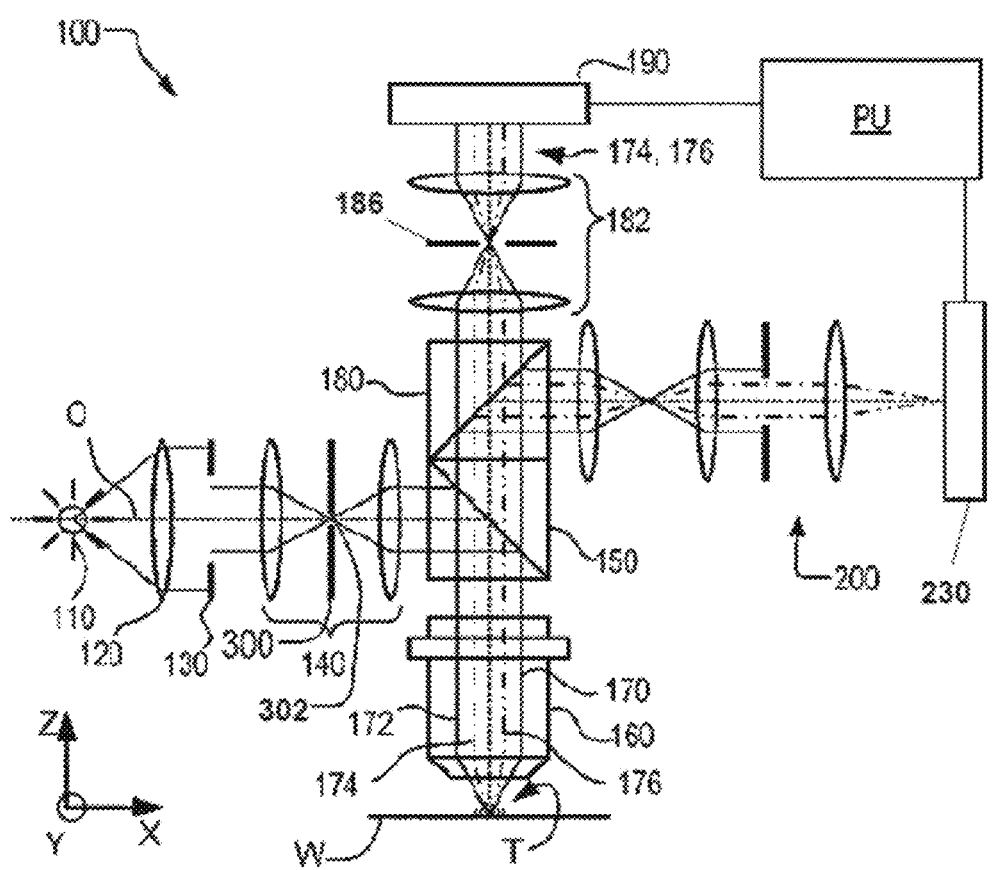
FIG. 3 is a schematic representation of a metrology apparatus.

FIG. 3 illustrates an example of a metrology apparatus 100 suitable for use in embodiments disclosed herein. The principles of operation of this type of metrology apparatus are explained in more detail in the U.S. Patent Application Nos. US 2006-033921 and US 2010-201963. An optical axis, which has several branches throughout the apparatus, is represented by a dotted line O. In this apparatus, radiation emitted by a source 110 (e.g., a xenon lamp) is directed onto a substrate W via an optical system comprising: a lens system 120, an aperture plate 130, a lens system 140, a partially reflecting surface 150 and an objective lens 160. In exemplary arrangements, the lens systems 120, 140, 160 are arranged in a double sequence of a 4F arrangement. In exemplary arrangements, the radiation emitted by radiation source 110 is collimated using lens system 120. A different lens arrangement can be used, if desired. The angular range at which the radiation is incident on the substrate can be selected by defining a spatial intensity distribution in a plane that presents the spatial spectrum of the substrate plane. In particular, this can be done by inserting an aperture plate 130 of suitable form between lenses 120 and 140, in a plane which is a back-projected image of the objective lens pupil plane. Different intensity distributions (e.g., annular, dipole, etc.) are possible by using different apertures. The angular distribution of illumination in radial and peripheral directions, as well as properties such as wavelength, polarization and/or coherency of the radiation, can all be adjusted to obtain desired results. For example, one or more interference filters 130 can be provided between the source 110 and the partially reflecting surface 150 to select a wavelength of interest in the range of, say, 400-900 nm or even lower, such as 200-300 nm. The interference filter may be tunable rather than comprising a set of different filters. A grating could be used instead of an interference filter. In an embodiment, one or more polarizers 170 can be provided between the source 110 and the partially reflecting surface 150 to select a polarization of interest. The polarizer may be tunable rather than comprising a set of different polarizers.

As shown in FIG. 3, the target T, which may be a feature fabricated on the substrate W, is placed with substrate W normal to the optical axis O of the objective lens 160. Thus, radiation from the source 110 is reflected by the partially reflecting surface 150 and focused into an illumination spot on the target T on the substrate W via the objective lens 160. In exemplary arrangements, the objective lens 160 has a high numerical aperture (NA), desirably at least 0.9 or at least 0.95. An immersion metrology apparatus (using a relatively high refractive index fluid such as water) may even have a numerical aperture over 1.

Rays of illumination 170, 172 focused to the illumination spot from angles off the axis O gives rise to diffracted rays 174, 176. It should be noted that these rays are just one of many parallel rays covering an area of the substrate including the target T. Each element within the illumination spot is within the field of view of the metrology apparatus. Since the aperture in the plate 130 has a finite width (necessary to admit a useful quantity of radiation), the incident rays 170, 172 will in fact occupy a range of angles, and the diffracted rays 174, 176 will be spread out somewhat. According to the point spread function of a small target, each diffraction order will be further spread over a range of angles, not a single ideal ray as shown.

At least the $0^{th}$ order diffracted by the target on the substrate W is collected by the objective lens 160 and directed back through the partially reflecting surface 150. An optical element 180 provides at least part of the diffracted beams to an optical system 182 which forms a diffraction spectrum (pupil plane image) of the target T on the sensor 190 (e.g. a CCD or CMOS sensor) using the zeroth and/or first order diffractive beams. In exemplary arrangements, an aperture 186 is provided to filter out certain diffraction orders so that a particular diffraction order is provided to the sensor 190. In exemplary arrangements, the aperture 186 allows substantially or primarily only zeroth order radiation to reach the sensor 190. In an embodiment, the sensor 190 may be a two-dimensional detector so that a two-dimensional angular scatter spectrum of a substrate target T can be measured. The sensor 190 may be, for example, an array of CCD or CMOS sensors, and may use an integration time of, for example, 40 milliseconds per frame. The sensor 190 may be used to measure the intensity of redirected radiation at a single wavelength (or narrow wavelength range), the intensity separately at multiple wavelengths or integrated over a wavelength range. Furthermore, the sensor may be used to measure the intensity of radiation separately with transverse magnetic-polarization and/or transverse electric-polarization and/or the phase difference between transverse magnetic-polarized and transverse electric-polarized radiation.

Optionally, optical element 180 provides at least part of the diffracted beams to measurement branch 200 to form an image of the target on the substrate W on a sensor 230 (e.g. a CCD or CMOS sensor). The measurement branch 200 can be used for various auxiliary functions such as focusing the metrology apparatus (i.e., enabling the substrate W to be in focus with the objective 160), and/or for dark field imaging of the type mentioned in the introduction.

In order to provide a customized field of view for different sizes and shapes of grating, an adjustable field stop 300 is provided within the lens system 140 on the path from source 110 to the objective lens 160. The field stop 300 contains an aperture 302 and is located in a plane conjugate with the plane of the target T, so that the illumination spot becomes an image of the aperture 302. The image may be scaled according to a magnification factor, or the aperture and illumination spot may be in 1:1 size relation. In order to make the illumination adaptable to different types of measurement, the aperture plate 300 may comprise a number of aperture patterns formed around a disc, which rotates to bring a desired pattern into place. Alternatively or in addition, a set of plates 300 could be provided and swapped, to achieve the same effect. Additionally or alternatively, a programmable aperture device such as a deformable mirror array or transmissive spatial light modulator can be used also.

Typically, a target will be aligned with its periodic structure features running either parallel to the Y axis or parallel to the X axis. With regard to its diffractive behavior, a periodic structure with features extending in a direction parallel to the Y axis has periodicity in the X direction, while the a periodic structure with features extending in a direction parallel to the X axis has periodicity in the Y direction. In order to measure the performance in both directions, both types of features are generally provided. While for simplicity there will be reference to lines and spaces, the periodic structure need not be formed of lines and space. Moreover, each line and/or space between lines may be a structure formed of smaller sub-structures. Further, the periodic structure may be formed with periodicity in two dimensions at once, for example where the periodic structure comprises posts and/or via holes.

Referring to FIGS. 4A to 4C, principles of a measurement technique using, for example, the metrology apparatus shown in FIG. 4 are described in the context of an overlay measurement. In FIG. 4A, a geometrically symmetric unit cell of a target T is shown. The target T can comprise just a single physical instance of a feature, such as a unit cell, or can comprise a plurality of physical instances of the feature or unit cell as shown in FIG. 4C.

The target T can be a specially designed target. In exemplary arrangements, the target is for a scribe lane. In exemplary arrangements, the target can be an in-die target, i.e., the target is among the device pattern (and thus between the scribe lanes). In exemplary arrangements, the target can have a feature width or pitch comparable to device pattern features. For example, the target feature width or pitches can be less than or equal to 300% of the smallest feature size or pitch of the device pattern, be less than or equal to 200% of the smallest feature size or pitch of the device pattern, be less than or equal to 150% of the smallest feature size or pitch of the device pattern, or be less than or equal to 100% of the smallest feature size or pitch of the device pattern.

The target T can be part of a semiconductor device structure. For example, the target T can be a portion of a memory device (which often has one or more structures that are, or can be, geometrically symmetric as discussed further below).

In an embodiment, the target T or a physical instance of the unit cell can have an area of less than or equal to 2400 square microns, an area of less than or equal to 2000 square microns, an area of less than or equal to 1500 square microns, an area of less than or equal to 1000 square microns, an area of less than or equal to 400 square microns, less than or equal to 200 square microns, less than or equal to 100 square microns, less than or equal to 50 square microns, less than or equal to 25 square microns, less than or equal to 10 square microns, less than or equal to 5 square microns, less than or equal to 1 square micron, less than or equal to 0.5 square microns, or less than or equal to 0.1 square microns. In an embodiment, the target T or a physical instance of the unit cell has a cross-sectional dimension parallel to the plane of the substrate of less than or equal to 50 microns, less than or equal to 30 microns, less than or equal to 20 microns, less than or equal to 15 microns, less than or equal to 10 microns, less than or equal to 5 microns, less than or equal to 3 microns, less than or equal to 1 micron, less than or equal to 0.5 microns, less than or equal to 0.2 microns, or less than or equal to 0.1 microns.

In exemplary arrangements, the target T or a physical instance of the unit cell has a pitch of structures of less than or equal to less than or equal to 5 microns, less than or equal to 2 microns, less than or equal to 1 micron, less than or equal to 500 nm, less than or equal to 400 nm, less than or equal to 300 nm, less than or equal to 200 nm, less than or equal to 150 nm, less than or equal to 100 nm, less than or equal to 75 nm, less than or equal to 50 nm, less than or equal to 32 nm, less than or equal to 22 nm, less than or equal to 16 nm, less than or equal to 10 nm, less than or equal to 7 nm or less than or equal to 5 nm.

In exemplary arrangements, the target T has a plurality of physical instances of the unit cell. Thus, a target T could typically have the higher dimensions listed here, while the physical instances of the unit cell will have the lower dimensions listed here. In an embodiment, the target T comprises 50,000 or more physical instances of the unit cell, 25,000 or more physical instances of the unit cell, 15,000 or more physical instances of the unit cell, 10,000 or more physical instances of the unit cell, 5,000 or more physical instances of the unit cell, 1000 or more physical instances of the unit cell, 500 or more physical instances of the unit cell, 200 or more physical instances of the unit cell, 100 or more physical instances of the unit cell, 50 or more physical instances of the unit cell, or 10 or more physical instances of the unit cell.

The physical instance of the unit cell or the plurality of physical instances of the unit cell may collectively fill a beam spot of the metrology apparatus. In that case, the measured results comprise essentially only information from the physical instance of the unit cell (or its plurality of instances). In an embodiment, the beam spot has a cross-sectional width of 50 microns or less, 40 microns or less, 30 microns or less, 20 microns or less, 15 microns or less, 10 microns or less, 5 microns or less, or 2 microns or less.

The unit cell in FIG. 4A comprises at least two structures that are, or will be, physically instantiated on the substrate. A first structure 400 comprises lines and a second structure 405 comprises an oval-type shape. Of course, the first and second structures 400, 405 can be different structures than depicted.

Further, in this example, there can be a relative shift between the first and second structures 400, 405 (or elements) of the features from their expected position due to their separate transfer onto the substrate so as to have an error in overlay. In this example, the first structure 400 is located in a higher layer on a substrate than the second structure 405. Thus, in an embodiment, the second structure 405 can be produced in a first lower layer in a first execution of a patterning process and the first structure 400 can be produced in a second higher layer than the first lower layer in a second execution of the patterning process. Now, it is not necessary that the first and second structures 400, 405 be located in different layers. For example, in a double patterning process (including, for example, an etching process as part thereof), the first and second structures 400, 405 could be produced in a same layer to form essentially a single pattern but there could still be an "overlay" concern in terms of their relative placement within the same layer. In this single layer example, both the first and second structures 400, 405 could have, for example, the form of lines like those shown in FIG. 4A for the first structure 400 but the lines of the second structure 405, already provided on the substrate by a first pattern transfer process, could be interleaved with the lines of the structure 400 provided in a second pattern transfer process.

Significantly, the unit cell has, or is capable of having, a geometric symmetry with respect to an axis or point. For example, the unit cell in FIG. 4A has reflection symmetry with respect to, for example, axis 410 and point/rotational symmetry with respect to, for example, point 415. Similarly, it can be seen that a physical instance of the unit cell (and thus a combination of physical instances of the unit cell) in FIG. 4C has a geometric symmetry.

In an embodiment, the unit cell has a geometric symmetry for a certain feature (such as overlay). Embodiments herein focus on the unit cell having zero overlay when it is geometrically symmetric. However, instead, the unit cell can have zero overlay for a certain geometric asymmetry. Appropriate offsets and calculations would then be used to account for the unit cell having a zero overlay when it has a certain geometric asymmetry. Pertinently, the unit cell should be capable of change in symmetry (e.g., become asymmetry, or become further asymmetric, or become symmetric from an asymmetric situation) depending on the certain feature value.

In the example of FIG. 4A, the unit cell has a geometric symmetry for a zero overlay (although it need not be zero overlay). This is represented by the arrows 420 and 425 which shows that the lines of the first structure 400 are evenly aligned with respect to the oval-type shape of the second structure 405 (and which even alignment at least in part enables the unit cell to have geometric symmetry as shown in FIG. 4A). So, in this example, when the unit cell has geometric symmetry, there is zero overlay. However, when there is an error in overlay (e.g., a non-zero overlay), the unit cell is no longer geometrically symmetric and by definition the target is no longer geometrically symmetric.

Further, where a target comprises a plurality of physical instances of the unit, the instances of the unit cell are arranged periodically. In an embodiment, the instances of the unit cell are arranged in a lattice. In an embodiment, the periodic arrangement has a geometric symmetry within the target.

So, in this technique, as discussed further hereafter, advantage is taken of the change in geometric symmetry (e.g., a change to a geometric asymmetry, or change to a further geometric asymmetry, or a change from geometric asymmetry to geometric symmetry) related to a feature asymmetry of interest (e.g., non-zero overlay) to be able to determine the feature asymmetry (e.g., non-zero overlay).

A target comprising a physical instance of the unit cell of FIG. 4A can be illuminated with radiation using, for example, the metrology apparatus of FIG. 3. The radiation redirected by the target can be measured, e.g., by detector 190. In an embodiment, an unprocessed pupil of the redirected radiation is measured, i.e., a Fourier transform plane. An example measurement of such a pupil is depicted as pupil image 430. While the unprocessed pupil image 430 has a diamond-type shape, it need not have such a shape. The term pupil and pupil plane herein includes any conjugates thereof unless the context otherwise requires (for example, where a pupil plane of a particular optical system is being identified). The pupil image 430 is effectively an image, specified in terms of an optical characteristic (in this case intensity), of a pupil of the redirected radiation.

For convenience, the discussion herein will focus on intensity of pixels in the pupil representation as an optical characteristic of interest. But, the techniques herein may be used with one or more alternative or additional optical characteristics, such as phase and/or reflectivity.

Further, for convenience, the discussion herein focuses on detecting and processing images of redirected radiation and in particular pupil images. However, the optical properties of the redirected radiation can be measured and represented in different manners than images. For example, the redirected radiation can be processed in terms of one or more spectrums (e.g., intensity as a function of wavelength). Thus, a detected image of redirected radiation can be considered as an example of an optical representation of the redirected radiation. So, in the case of a pupil plane image, a pupil image is an example of a pupil representation.

Further, the redirected radiation can be polarized or non-polarized. In an embodiment, the measurement beam radiation is polarized radiation. In an embodiment, the measurement beam radiation is linearly polarized.

In an embodiment, a pupil representation is of primarily, or substantially, one diffraction order of redirected radiation from the target. For example, the radiation can be 80% or more, 85% or more, 90% or more, 95% or more, 98% or more or 99% or more, of a particular order of the radiation. In an embodiment, the pupil representation is of primarily, or substantially, zeroth order redirected radiation. This can occur, for example, when the pitch of the target, the wavelength of the measurement radiation, and optionally one or more other conditions cause the target to redirect primarily zeroth order (although there can be radiation of one or more higher orders). In an embodiment, a majority of the pupil representation is zeroth order redirected radiation. In an embodiment, the pupil representation is of zeroth radiation and separately of $1^{st}$ order radiation, which can then be linearly combined (superposition). The aperture 186 in FIG. 3 can be used to select a particular order, e.g., the zeroth order, of radiation.

Having regard to pupil image 430 corresponding to the geometrically symmetric unit cell of the first and second structures 400, 405, it can be seen that the intensity distribution is essentially symmetric within the pupil image (e.g., with the same symmetry type as of the geometric structure). This is further confirmed by removing the symmetric intensity distribution portion from the pupil image 430, which results in the derived (or post-processed) pupil image 435 (also known as a differential pupil image). To remove the symmetric intensity distribution portion, a particular pupil image pixel (e.g., a pixel) can have the symmetric intensity distribution portion removed by subtracting from the intensity at that particular pupil image pixel the intensity of a symmetrically located pupil image pixel, and vice versa. In exemplary arrangements, the pixel can correspond to the pixels of the detector (e.g., detector 190), but it need not; for example, a pupil image pixel could be a plurality of the pixels of the detector. In exemplary arrangements, the point or axis of symmetry across which pixel intensities are subtracted corresponds with a point or axis of symmetry of the unit cell. So, for example, considering pupil image 430, the symmetry intensity distribution portion can be removed by, for example, subtracting from the intensity $I_i$ that particular pixel shown the intensity $I_i'$ from a symmetrically located pixel, i.e., symmetrically located with respect to axis 432. Thus, the intensity at a particular pixel with the symmetrical intensity portion removed, $S_i$, is then $S_i = I_i - I_i'$. This can be repeated for a plurality of pixels of the pupil image, e.g., all the pixels in the pupil image. As seen in the derived pupil image 435, the intensity distribution corresponding to the symmetric unit cell is essentially completely symmetric. Thus, a symmetric target with a symmetric unit cell geometry (and if applicable, a certain periodicity of instances of the unit cell) results in a symmetric pupil response as measured by a metrology apparatus.

Referring now to FIG. 4B, an example of an error in overlay is depicted with respect to the unit cell depicted in FIG. 4A. In this case, the first structure 400 is shifted in the X-direction with respect to the second structure 405. In particular, the axis 410 centered on the lines of the first structure 400 has shifted to the right in FIG. 4B to axis 445. Thus, there is an error in the overlay 440 in the X-direction; that is, an X direction overlay error. Of course, the second structure 405 could be shifted relative to the first structure 400 or both could be shifted relative to each other. In any event, the result is an X direction overlay error. However, as should be appreciated from this unit cell arrangement, a purely relative shift in the Y-direction between the first structure 400 and the second structure 405 would not change the geometric symmetry of this unit cell. But, with an appropriate geometric arrangement, overlay in two directions or between different combinations of parts of the unit cell can change symmetry and could also be determined.

As a consequence of the change in the physical configuration of the unit cell from the nominal physical configuration of the unit cell in FIG. 4A and represented by the error in overlay 440, the result is that the unit cell has become geometrically asymmetric. This can be seen by the arrows 450 and 455 of different length, which show that the oval-type shape of the second structure 405 is unevenly located relative to the lines of the first structure 400. The symmetry is examined with respect to the point or axis of symmetry of the pupil image 430, i.e. in that case, axis 432 which is now shown axis 434.

The physical instance of the unit cell of FIG. 4B can be illuminated with radiation using, for example, using the metrology apparatus of FIG. 3. A pupil image of the redirected radiation can be recorded, e.g., by detector 190. An example of such a pupil image is depicted as pupil image 460. The pupil image 460 is effectively an image of the intensity. While the pupil image 460 has a diamond-type shape, it need not have such a shape; it can be a circular shape or any other shape. Moreover, the pupil image 460 is of a substantially same axis or coordinate location as pupil image 430. That is, in this embodiment, an axis of symmetry 410 in the unit cell of FIG. 4A and the same axis in the unit cell of FIG. 4B align with an axis of symmetry 432 of the pupil images 430, 460.

Having regard to pupil image 460 corresponding to the geometrically asymmetric unit cell of the first and second structures 400, 405, it visually seems like the intensity distribution is essentially symmetric within the pupil image. However, there is an asymmetric intensity distribution portion within the pupil image. This asymmetric intensity distribution portion is due to the asymmetry in the unit cell. Moreover, the asymmetric intensity distribution is significantly lower in magnitude than a symmetric intensity distribution portion in the pupil image.

So, in exemplary arrangements, to more effectively isolate the asymmetric intensity distribution portion, the symmetric intensity distribution portion can be removed from the pupil image 460, which results in the derived pupil image 465. Like with obtaining derived pupil image 435, a particular pupil image pixel (e.g., a pixel) can have the symmetric intensity distribution portion removed by subtracting from the intensity at that particular pupil image pixel the intensity of a symmetrically located pupil image pixel, and vice versa, as discussed above. So, for example, considering pupil image 460, the symmetry intensity distribution portion can be removed by, for example, subtracting from the intensity $I_i$ at that particular pixel shown the intensity $I_i'$ from a symmetrically located pixel, i.e.; symmetrically located with respect to axis 432 to yield $S_i$. This can be repeated for a plurality of pixels of the pupil image, e.g., all the pixels in the pupil image. In FIGS. 4A and 4B, the full derived pupil images of $S_i$ are depicted for explanation purposes. As will be appreciated, half of a derived pupil image of FIG. 4A or 4B is the same as the other half thereof. So, in an embodiment, the values from only half of the pupil image can be used for further processing discussed herein and so a derived image pupil used in further processing herein can be only half of the $S_i$ values for a pupil.

As seen in the derived pupil image 465, the intensity distribution measured using a physical instance of an asymmetric unit cell is not symmetric. As seen in regions 475 and 480, there is an asymmetric intensity distribution portion visible once the symmetric intensity distribution portion is removed. As noted above, the full derived pupil image 465 is shown and so the asymmetric intensity distribution portion is shown on both halves (even though they are equal to each other in terms of magnitude and distribution in their respective halves).

Thus, an asymmetry in the geometrical domain corresponds to an asymmetry in the pupil. So, in exemplary arrangements, a method is provided that uses the optical response of a periodic target that possesses, or is capable of, inherent geometric symmetry in its physical instance of a unit cell to determine a parameter corresponding to a physical configuration change that causes a change in geometric symmetry (e.g., cause an asymmetry, or cause a further asymmetry, or cause an asymmetric unit cell to become symmetric) of the physical instance of the unit cell. In particular; in an embodiment, an overlay induced asymmetry (or lack thereof) in the pupil as measured by a metrology apparatus can be exploited to determine the overlay. That is, the pupil asymmetry is used to measure the overlay within the physical instance of the unit cell and thus within the target.

To consider how to determine the parameter corresponding to a physical configuration change that causes a geometric asymmetry in a unit cell, the intensity of a pixel in the pupil image can be considered in terms of the physical characteristics of the target that impact that pixel. To do so, an overlay example will be considered but the techniques and principles can be extended to another parameter corresponding to a physical configuration change that causes a geometric asymmetry in a unit cell (e.g., asymmetric sidewall angle, asymmetric bottom wall tilt, ellipticity in contact holes, etc.).

Referring back to the unit cells of FIGS. 4A and 4B, the intensity of a pixel $I_i$, $I_i'$ in the pupil image 460 can be evaluated analytically as a combination of intensity components attributable to different physical characteristics of the unit cell. In particular, the physical configuration changes from the symmetric unit cell to the asymmetric unit cell can be evaluated to determine in what manner the intensity distribution changes and specifically within a pupil image.

So, in a very simple example to illustrate the principles, several changes in physical configuration of the unit cell profile can be evaluated (but of course more or different physical configuration changes can occur). One of the physical configuration changes that will be considered is the change in height of the structure 400 in the Z direction, which is designated as $\Delta x_h$. But, significantly, this change in height will generally be uniform across the physical instance of the unit cell. That is, the $\Delta x_h$ will result in a same changed physical configuration of the unit cell at one side of an axis or point of symmetry as at another side of the axis or point of symmetry. Similarly, other physical configuration changes, such as CD, sidewall angle, etc. changes, will also be generally uniform across the physical instance of the unit cell and thus yield a same changed physical configuration of the unit cell at one side of an axis or point of symmetry as at another side of the axis or point of symmetry. So, for convenience, only $\Delta x_h$ will be considered, but is representative of numerous other physical configuration changes that are uniform across the unit cell.

Another one of the physical configuration changes of the unit cell of interest is the relative shift between structure 400 and structure 405, namely the change in overlay 440. This overlay shift will be referred to as $\Delta x_{ov}$. Of course, the overlay can be considered in a different or additional direction. Significantly, the $\Delta x_{ov}$ will result in a different physical configuration of the unit cell at one side of an axis or point of symmetry than at another side of the axis or point of symmetry; each pair of symmetric pixels has information about overlay. Significantly, while change in most target profile parameters (CD, height, etc.) induce symmetric changes in the pupil (and thus can be considered symmetric parameters), change in overlay results in an asymmetric change in the measured pupil. Thus, a change in overlay gives an asymmetric pupil response. Further, most, if not all, other unit cell profile parameters do not create asymmetry of the unit cell or the pupil response. However, they can have an effect on the measured overlay value. As discussed below, to the first order, other unit cell profile parameters may have no effect. In exemplary arrangements, to a second or higher order, other unit cell profile parameters have an effect on determination of the overlay value. Hence, by measuring the pupil asymmetry, overlay can be determined therefrom.

Specifically, to evaluate how overlay can be determined from an unprocessed pupil asymmetry, the intensity of a pixel i in the pupil image 460 can be defined as:

$$I_i = I_0 + a\Delta x_{ov} + d\Delta x_h + b\Delta x_{ov}\Delta x_h + e\Delta x_{ov}^2 + f\Delta x_h^2 + \ldots \\ c\Delta x_{ov}^3 + \ldots \quad (1)$$

where $I_0$ is a base intensity attributable to the illumination radiation and a, e, f and g are coefficients. So, similarly, the intensity of the complementary symmetric pixel $I'_i$ in the pupil image 460 can be defined as:

$$I'_i = I_0 + a'\Delta x_{ov} + d'\Delta x_h + b'\Delta x_{ov}\Delta x_h + e'\Delta x_{ov}^2 + f'\Delta x_h^2 + \ldots \\ c'\Delta x_{ov}^3 + \ldots \quad (2)$$

where coefficients a', b', c', d', e' and f' are specific to the intensity of the complementary symmetric pixel $I'_i$ and are comparable to the coefficients a, b, c, d, e and f for the intensity of a pixel $I_i$ in the pupil image 460.

The difference of the intensity $S_i = I_i - I'_i$ between the symmetric pixels in the pupil image 460 can then be evaluated as:

$$S_i = I_i - I'_i = (a-a')\Delta x_{ov} + (b-b')\Delta x_{ov}\Delta x_h + (c-c')\Delta x_{ov}^3 + \ldots \quad (3)$$

It has been discovered that due to, e.g., symmetry, all the terms that can contain only symmetric parameters, such as $e\Delta x_h$, drop out as seen in equation (3). Further, due to, e.g., symmetry, the terms with an even power of overlay have been discovered to be equal for symmetrically positioned pixels and so terms such $\Delta x_{ov}^2$ likewise drop out. That leaves, terms that have a combination of overlay with a symmetric parameter and terms that have only overlay to an odd power (e.g., to the power of 1, 3, 5, 7, etc.).

In equation (3) above, it has been discovered that the difference of the intensity $S_i$ is primarily dependent on $a\Delta x_{ov}$. That is, the difference of the intensity $S_i$ is in great part linearly dependent on overlay or more significantly, overlay is in great part linearly dependent on the intensity, specifically the difference of the intensity $S_i$. Thus, a combination of the intensities of the pixels can yield a good estimated value of the overlay when linearly combined with an appropriate conversion factor.

So, in exemplary arrangements, it has been discovered that an overlay can be determined from a combination of intensities of the pixels that are appropriately weighted (wherein the weighting themselves acts a conversion factor of intensity to overlay or that can be combined with a conversion factor from intensity to overlay). In an embodiment, an overlay signal can be described as:

$$M = \Sigma_i w_i S_i \quad (4)$$

wherein the overlay signal M is the weighted combination of the signal components $S_i$ in the measured pupil and $w_i$ are the respective weights for each of the signal components $S_i$ (and the weights act as a conversion factor between the signal component and overlay; as noted above, instead, a conversion factor could be used in combination with weights that do not act to convert the signal component to overlay). In an embodiment, the weights $w_i$ are a vector whose magnitude is related to the overlay. As noted above, the signal components $S_i$ can be determined for half of the measured pupil. In exemplary arrangements, if the signal components $S_i$ have a substantially same magnitude for all pairs (N/2) of symmetric pixels (N), then the signal components $S_i$ can be averaged and combined with a conversion factor C from the total of the signal components $S_i$ to overlay according to the following formula to yield a total overlay:

$$M = C \frac{2}{N} \sum_{i}^{N/2} S_i.$$

So, in exemplary arrangements, the weights can have two roles—one is as a trust per pair of pixels in respect of its measurement of overlay and the other role is to convert a value of the optical characteristic of the signal component (e.g., intensity level, e.g., gray level) to an overlay value (in terms of, e.g., nanometers), As discussed above, the second role can be delegated to a conversion factor.

But, where, e.g., the signal components $S_i$ do not have a substantially same magnitude for all pairs of symmetric pixels, weighting all pixels in the measured pupil equally could result in a low signal-to-noise ratio (poor precision). So, it is desirable to weight those pixels that are sensitive to overlay to have a greater contribution to the calculation of the overlay. So, in exemplary arrangements, pixels sensitive to overlay get different (e.g., higher) weights than those pixels that have low sensitivity to overlay (effectively inactive pixels). As noted above, the pixels in regions 475 and 480 of the derived pupil 465 have relatively higher sensitivity to overlay while the remaining pixels in the derived pupil 465, which have low to no intensity relative to the pixels in regions 475 and 480, have low sensitivity to overlay (and accordingly should be weighted to have lower contribution to the overlay determination).

In exemplary arrangements, the weights are effectively determined for the $a\Delta x_{ov}$ term of equation (3). In an embodiment, the weights can be extended to be determined for the $a\Delta x_{ov}$ term as well as the $b\Delta x_{ov}\Delta x_h$ (and typically other comparable terms for other parameters, such as CD, sidewall angle, etc.). However, this calculation can be more complex than determining the weights effectively only for the $a\Delta x_{ov}$ term of equation (3). Moreover, there is a trade: off between robustness to non-linear processes (for symmetric parameters) and precision of determining overlay (i.e., in terms of how close the determined values are for each determination of the same actual overlay). So, there can be a sacrifice of precision for enhanced robustness using this calculation. Accordingly, an optimization can be performed to enhance precision (e.g., maximizing the influence of the linear terms and suppressing the non-linear terms), enhance robustness (e.g., maximizing the non-linear terms) or find a balance of both. But, in any event, the use of a combination of intensities linearly combined with associated weightings can lead to a quick determination of overlay as it requires merely a pupil acquisition and simple calculation of equation (4).

In exemplary arrangements, where higher order terms become significant, a non-linear solution technique can be adopted to solve equation (3) having the $c\Delta x_{ov}^3$ and/or other higher order terms. As will be appreciated, a non-linear solution technique can be more complex than simply multiplying each of the signal components $S_i$ in the measured pupil with a respective weight $w_i$ for each of the signal components $S_i$ and then adding all of them up. Moreover, there is again a trade-off between robustness to non-linear processes and precision of determining overlay (i.e., in terms of how close the determined values are for each determination of the same actual overlay). So, there can be a sacrifice of precision for enhanced robustness using this calculation. Accordingly, an optimization can be performed to enhance precision and/or enhance robustness.

So, with the realization of an asymmetric intensity distribution arising from a geometric asymmetry of a unit cell caused by overlay, the error in overlay can be determined through an analysis that has a focus on this asymmetric intensity distribution. Thus, a technique for determining overlay from the asymmetric intensity distribution arising due to the change in physical configuration of a target associated with overlay will now be discussed.

Methods and apparatuses disclosed herein propose a generalization of the principles of pupil transformation applied in at-resolution overlay techniques described above with the goals of extending the area of application to an asymmetric stack of features, reducing parameter cross-correlations, and reducing the sensitivity to nominal configuration (i.e. to the recipe).

Figure 5:
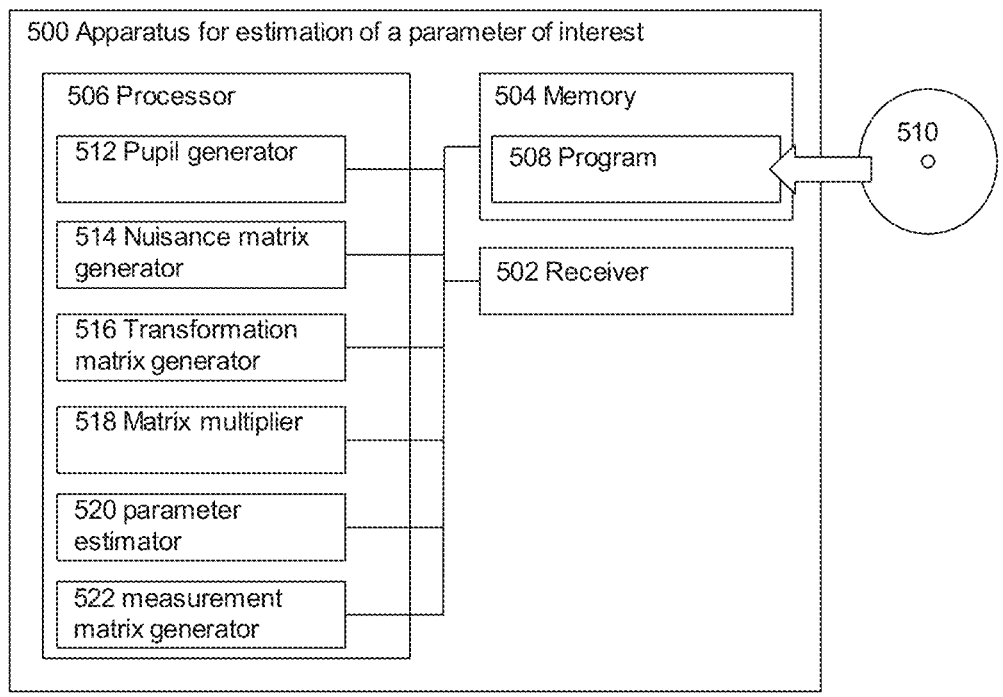
FIG. 5 is a schematic representation of an apparatus for estimation of a parameter of interest.

FIG. 5 shows a schematic representation of an apparatus 500 configured to estimate a parameter of interest, such as overlay. The apparatus 500 may form part of a metrology apparatus, such as that shown schematically in FIG. 3. The apparatus 500 comprises a receiver 502. The receiver 502 is configured to receive radiation that has been emitted, e.g. by the radiation source 110 and has subsequently been scattered from the target T. The target T may comprise one or more features on a substrate, including target features fabricated on the substrate for metrology purposes, periodic device structures (e.g., semiconductor device structures) and/or non-periodic device structures. The receiver 502 may comprise a sensor, such as the sensor 190 of FIG. 3.

The apparatus 500 further comprises a memory 504 and a processor 506. The memory 504 may comprise a non-volatile memory and/or a volatile memory. The memory 504 may have a computer program 508 stored therein. The computer program 508 may be configured to undertake methods disclosed herein by being executed using the processor 506. The computer program 508 may be loaded in the memory 504 from a non-transitory computer readable medium 510, on which the computer program is stored. The processor 506 is configured to undertake, by, e.g., the program 508, one or more of the functions of a pupil generator 512, a nuisance matrix generator 514, a transformation matrix generator 516, a matrix multiplier 518, an overlay estimator 520 and a measurement matrix generator 522, as set out herein. In some arrangements, the apparatus 500 may comprise only the nuisance matrix generator 514 or the measurement matrix generator 522.

Each of the receiver 502, memory 504, processor 506, pupil generator 512, nuisance matrix generator 514, transformation matrix generator 516, matrix multiplier 518 and overlay estimator 520 is in data communication with the other features 502, 504, 506, 508, 512, 514, 516, 518, 520 of the apparatus 500 as appropriate. The apparatus 500 can be implemented as a combination of computer hardware and software. In particular, the pupil generator 512, nuisance matrix generator 514, transformation matrix generator 516, matrix multiplier 518 and overlay estimator 520 may be implemented as software configured to run on the processor 506, or as combinations of hardware and software in separate modules. The memory 504 may store the various programs/executable files that are implemented by a processor 506, and also provides a storage unit for any required data. The programs/executable files stored in the memory 504, and implemented by the processor 506, can include the pupil generator 512, nuisance matrix generator 514, transformation matrix generator 516, matrix multiplier 518 and overlay estimator 520, but are not limited to such.

Figure 6:
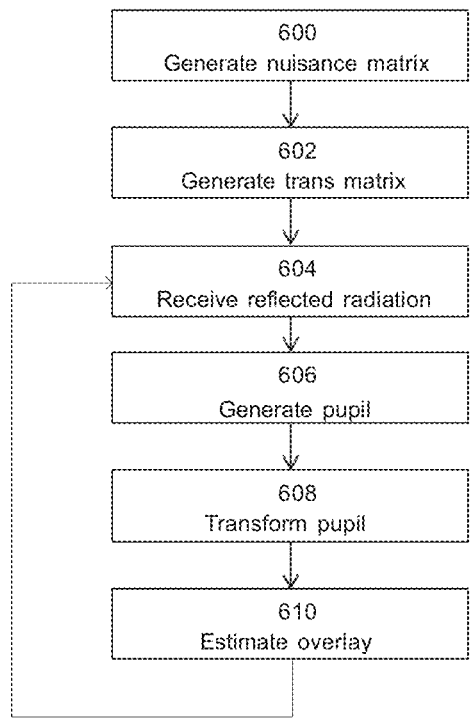
FIG. 6 is a flow chart showing a method for estimation of a parameter of interest.

FIG. 6 shows a method for estimation of a parameter of interest of a structure fabricated on a substrate. The substrate has a plurality of features fabricated thereon. The features may comprise semiconductor device structures or other structures fabricated on the substrate, such as metrology targets. Each of the features comprises a plurality of structure parameters, which include the parameter of interest, but also include a one or more nuisance parameters.

Generally, a nuisance parameter is any structural parameter of the features on the substrate except the parameter of interest that contributes to a measured intensity of pixels in an image, e.g. a pupil image, determined based on radiation received at the receiver 502. A nuisance parameter disguises or obfuscates the proportion of the intensity of each pixel that is caused by the parameter of interest. In exemplary methods and apparatuses, the parameter of interest may be overlay. In such scenarios, an exemplary nuisance parameter may include: line width of a feature; height of a line of a feature; sidewall angle of a feature; thickness of a homogenous material (e.g. the substrate) below the feature; and/or refractive index of one or materials in the stack or feature.

In the exemplary method of FIG. 6, the nuisance matrix generator 514 is configured to generate 600 a nuisance matrix D that comprises one or more elements corresponding to one or more nuisance parameters. This may be done mathematically and an exemplary method for doing so is described herein. In addition, it is possible to obtain a nuisance matrix based on a number of measurements obtained from a plurality of features of a structure and a corresponding further exemplary method is also disclosed herein.

In exemplary arrangements, the nuisance matrix generator 514 determines elements of the nuisance matrix based on a mathematical expansion of a function representing a feature fabricated on the substrate. The mathematical expansion may be such that it separates one or more nuisance parameters from the parameter of interest. In one exemplary arrangement described herein, the mathematical expansion is a Taylor series expansion and the function is $I'(p+s)$, describing an unprocessed pupil representation of a measured feature.

Given a nominal feature, which is a model of the feature to be measured and can be represented by a vector of structure parameters p (where p will be the nominal working point of the model), a post-processed pupil intensity for the actual measured feature can be represented by a vector of parameters p+s, where s is the vector of differences in structure parameters with respect to the nominal (or modelled) feature. Therefore, p+s can serve as a synthetic measurement of the measured feature and can be written as a Taylor series expansion around p, as set out below.

Figure 7A:
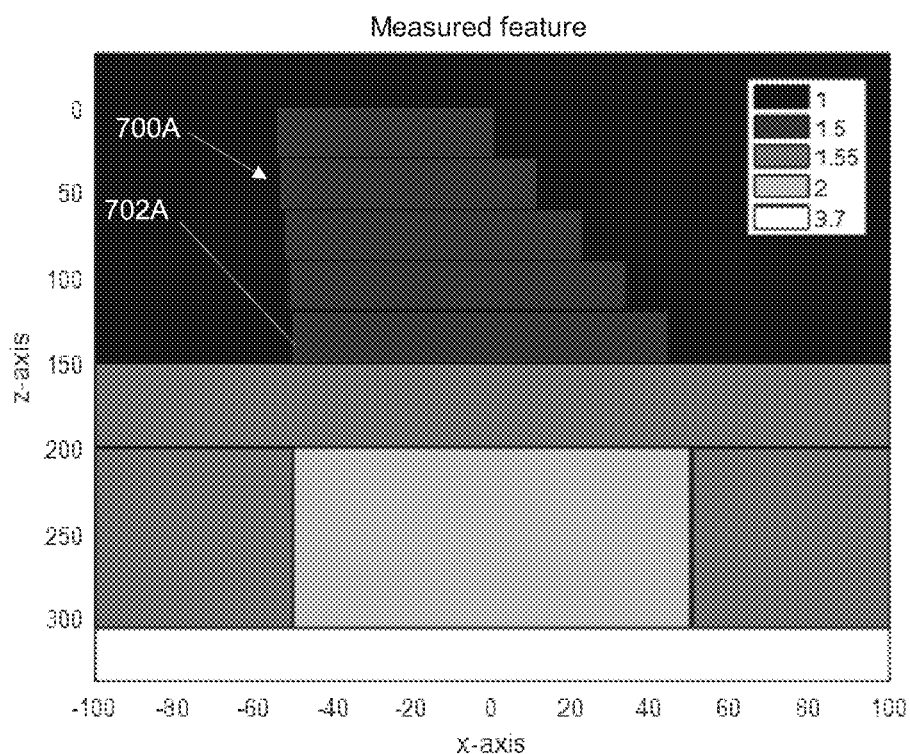
FIGS. 7A and 7B respectively show a measured feature and a feature model corresponding to the measured feature.
Figure 7B:
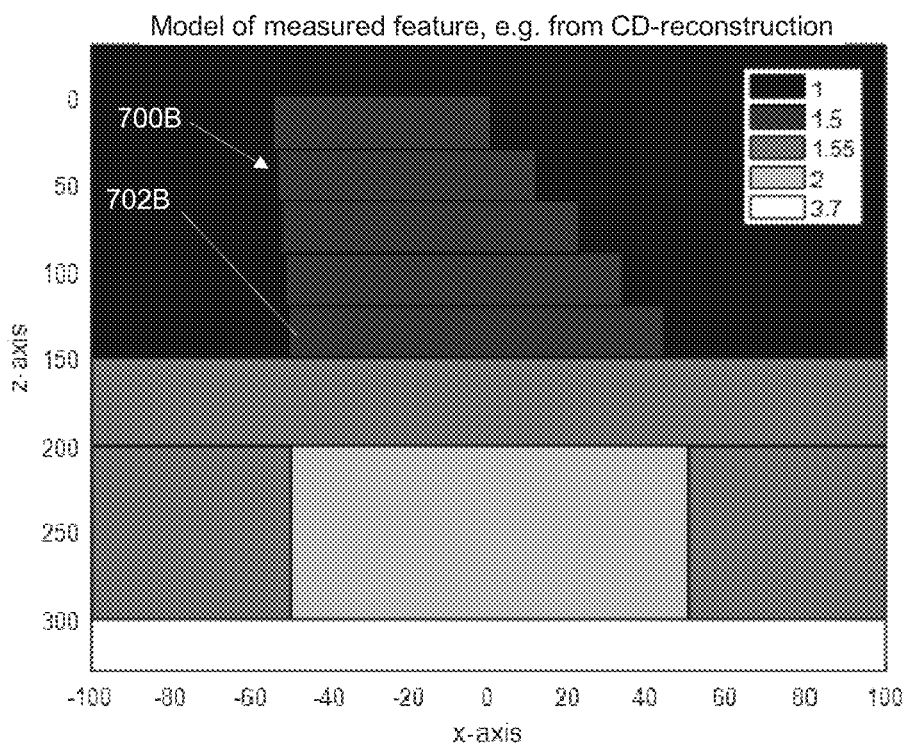

FIGS. 7A and 7B show a measured feature and a feature model corresponding to the measured feature respectively. As can be seen from FIGS. 7A and 7B, the features comprise stacks 700A, 700B that are used to form a grating. The two stacks 700A, 700B are asymmetric although this is not a requirement for the use of exemplary methods and apparatuses disclosed herein. The bottom grating 702A of the stack 700A of the measured feature is 5 nm thicker than the bottom grating 702B of the stack 700B of the feature model. The feature model may be determined using reconstructive techniques for CD and/or one or more other structure parameters of the feature.

Measurements of a substrate having one or more physical instances of the feature provided thereon as a target are obtained. In exemplary methods and apparatuses, the measurements are of the feature after etch. In exemplary methods and apparatuses, the measurements are of the feature after development but before etch. In exemplary methods and apparatuses, the feature is a device structure. In exemplary methods and apparatuses, the measurements can be made, or have been made, using a metrology apparatus such as the metrology apparatus of FIG. 3. For example, the feature can comprise a physical instance of the unit cell of FIG. 4A or FIG. 4B, e.g. a single instance or a plurality of adjacent instances as shown in FIG. 4C. In exemplary methods and apparatuses, measurements of a plurality of features (and thus of a plurality of physical instances of the unit cell) are obtained. In exemplary methods and apparatuses, the measurements are of features that are distributed across the substrate. In exemplary methods and apparatuses, a plurality of substrates, each with one or more features (each having one or more physical instances of the unit cell), is measured.

Then, a reconstruction process, such as those known to the skilled person, is used to derive a feature model (or nominal feature profile) of the physical instance of the feature. The reconstruction process obtains an expected profile of the feature to start and facilitate the reconstruction process. In exemplary methods and apparatuses, the determined feature model is obtained from an average of the profile of features across one or more substrates. For example, a radiation distribution for each feature can be processed to derive a particular profile of that instance of the feature and then the profiles for the plurality of instances of the feature can be averaged together to derive the feature model. In exemplary methods and apparatuses, the feature model comprises at least a geometric profile of the target. In an embodiment, the geometric profile is a 3-D profile. In exemplary methods and apparatuses, the feature model comprises information regarding one or more materials properties of one or more layers making up the physical feature.

Therefore, in exemplary methods and apparatuses, the feature model can be considered as a center of gravity for the values of various parameters of the profile of the feature (and thus the unit cell) obtained from measuring numerous instances of the feature across the substrate and optionally on more than one substrate. But, in exemplary methods and apparatuses, the feature model can have different forms and be more specific. For example, the feature model can be defined for one or more particular instances of a target (e.g., by using values from the same target location(s) from multiple substrates). As another example, the feature model can be defined for a particular substrate (e.g., by using values from only that substrate).

Using the feature model, the Taylor series expansion of I'(p+s) can be written as:

$$I'(p+s) = I'(p) + \partial_{p1} I'(p) s_1 + \partial_{p2} I'(p) s_2 + \frac{1}{2} \partial_{p_1^2} I'(p) s_1^2 + \frac{1}{2} \partial_{p_2^2} I'(p) s_2^2 + \partial_{p_1 p_2} I'(p) + \ldots \quad (5)$$

The above assumes that the vector of structure parameters p comprises two parameters: the parameter of interest, in this case overlay; and one nuisance parameter. It will be appreciated that in other exemplary methods and apparatuses, the vector p may comprise any number of structure parameters. Further, it can be shown that the second term $(\partial_{p1} I'(p) s_1)$ of the above Taylor series expansion (5) corresponds to overlay, which in this case is the parameter of interest. All subsequent terms can be considered to relate to nuisance parameters.

In exemplary methods and apparatuses, the nuisance matrix generator 514 is configured to generate the nuisance matrix D based on the Taylor series expansion (5) of I'(p+s). In a specific example, the nuisance matrix generator 516 is configured to generate the nuisance matrix comprising one or more derivative parts of the subsequent (e.g., third onwards) terms of the above Taylor series expansion (5). Further, each column of the nuisance matrix D may comprise one or more of the derivative parts of the subsequent terms of the Taylor series expansion (5). It is noted that the terms of the Taylor series expansion (5) each relate to p, which is a vector, and therefore each term is a vector comprising a plurality of values equivalent to the number of pixels in the pupil image.

Expanding on the scenario in which p comprises two structure parameters, an exemplary nuisance matrix D may be:

$$[\partial_{p_2} I'(p)] \quad (6)$$

In the above case, the nuisance matrix D (6) comprises the derivative part of the third term of the Taylor series expansion (5), although more terms may be included. For example, the derivative parts of the third and fifth terms of the Taylor series expansion (5) may be used, resulting in a nuisance matrix D (7) of:

$$[\partial_{p_2} I'(p) \partial_{p_2^2} I'(p)] \quad (7)$$

In order to determine a post-processed pupil representation I the measured pupil representation I' may be multiplied by a transformation matrix W, such that:

$$I = WI' \quad (8)$$

The transformation matrix generator 516 generates 602 a transformation matrix W. This is done based on the determined nuisance matrix D. In an exemplary arrangement, the transformation matrix W may be determined such that a proportion of the intensity of the post-processed pupil representation I caused by the one or more nuisance parameters relating to the elements of the nuisance matrix D is reduced or made zero on multiplication with the transformation matrix W. In some exemplary methods and apparatuses, the proportion of the intensity of the post-processed pupil may be reduced by greater than 50%, by greater than 80% or by 100%, the latter satisfying the condition that WD=0. Put another way, the transformation matrix W may be determined such that the post-processed pupil representation I is less sensitive to the one or more nuisance parameters of the feature relating to the terms of the Taylor series expansion (5) included in the nuisance matrix D. The sensitivity of the post-processed pupil representation may be reduced by greater than 50%, by greater than 80% or by 100%, the latter satisfying the condition that WD=0.

A ratio between a proportion of the intensity of the post-processed pupil representation I caused by the parameter of interest and the proportion of the intensity of the post-processed pupil representation I caused by the one or more nuisance parameters relating to the elements of the nuisance matrix D may be increased when the measured pupil representation I' is multiplied by the transformation matrix W.

In exemplary methods and apparatuses, the transformation matrix generator 516 may be configured to decompose the nuisance matrix D into a singular value decomposition, $USV^H$, such that:

$$WD = WUSV^H = W\Sigma_{k=1}^{np} s_k u_k v_k^H \quad (9)$$

where np is the number of columns in the nuisance matrix D, which in the case that D contains only the first order derivatives of equation (5) with respect to the one or more nuisance parameters, then np is equal to the number of nuisance parameters. In exemplary arrangements, the first derivative of equation (5) with respect to the parameter of interest is not part of D. In some exemplary arrangements, higher order derivatives of equation (5) with respect to the one or more nuisance parameters are also included as columns in D, in which case np is larger than the number of nuisance parameters in the nuisance matrix.

There are a number of interpretations of a singular value decomposition and in one, classical interpretation the matrix U is a square matrix having a dimension equal to m×m, wherein the nuisance matrix D is an m×n matrix, and V is a square n×n matrix. In exemplary arrangements, m is equal to the number of pixels in the unprocessed pupil image ($n_a$) and n is equal to np, as mentioned above. In the case of nuisance matrix D (6), m is 1 and n is 2. Therefore, U is a 2×2 matrix. The first column of the matrix U therefore comprises the values of $u_k$ for k=1 to k=np, which in this case is one. The transformation matrix generator 516 may therefore select any other values of the matrix U (i.e. not those in the first column) as the elements of the transformation matrix W.

In one example, the transformation matrix may be determined to be:

$$W = [u_{n_p+1}, u_{n_p+2}, \ldots u_{n_a}]^H$$

where $n_a$ is the total number of rows in the matrix U. Note that the transformation matrix generator 516 has determined the transformation matrix W to be a conjugate transpose of the elements $u_{n_p=1}$, $u_{n_p+2}$, ... $u_{n_a}$.

It is a property of the matrix U that each column of the matrix is orthogonal to the other columns of the matrix U. As a result, the product of each element of the matrix U with any other element of the matrix U equals zero. By determining the transformation matrix W to comprise elements of the matrix U that are different to the values of $u_k$ for k=1 to k=np, when the transformation matrix W is multiplied by the nuisance matrix D, the result is zero.

Then, using the orthogonality property $u_i^H u_j = \delta_{ij}$ ($\delta_{ij}$ is the Kronecker delta), there is obtained:

$$WD = [u_{n_p+1} u_{n_p+2}, \ldots u_{n_a}]^H \Sigma_{k=1}^{np} s_k u_k v_k^H \quad (10)$$

In this way the symmetry requirement of the feature stack has been eliminated and the feature stack need not be asymmetric for determination of the parameter of interest, e.g. overlay.

Once the transition matrix is determined, the receiver 502 receives 604 radiation that is scattered from the measured feature on the substrate.

The pupil generator 512 generates 606 an unprocessed pupil representation I' of the received radiation. The unprocessed pupil representation I' may comprise a plurality of pixels, each having an intensity. The intensity of each pixel comprises a contribution from the parameter of interest and a contribution from each of the one or more nuisance parameters.

The matrix multiplier 518 multiplies 608 the unprocessed pupil representation I' by the transformation matrix W to determine a post-processed pupil representation I in which the effects of one or more nuisance parameters are mitigated or removed. In the example given above in which the transformation matrix satisfied the condition that WD=0, the effect of the one or more nuisance parameters for which the one or more derivatives of the corresponding terms of the Taylor series expansion (5) are included in the nuisance matrix D is removed.

It is noted that in order to allow matrix operations to be undertaken on the pixels of the unprocessed pupil I', those pixels are arranged in a long vector. The ordering can be arbitrary, although in the methods described herein, the pupils of the unprocessed pupil representation are read columnwise.

The parameter estimator 520 estimates 610 the parameter of interest, which in this case is overlay, based on the post-processed pupil representation. This may be done in a similar way to that described above. The process steps 604-610 may be repeated for multiple features on multiple substrates using the same transformation matrix W. Alternatively, the nuisance matrix D and transformation matrix W may be determined in real time for each measured feature.

In order to demonstrate the performance of the methods and apparatuses disclosed herein, a simple stack 700A shown in FIG. 7A is considered with the feature model of the nominal stack 700B shown in FIG. 7B and that approximates the actual stack. Note that the two stacks are asymmetric and the bottom grating of measured stack 700A is 5 nm thicker compared to the bottom grating of the nominal stack 700B.

A first nuisance matrix is as in, e.g., (6) above and a second nuisance matrix is as in, e.g., (7) above. The synthetic measurement of the feature is generated as:

$$I'_{meas} = I'(p+s) + I'_{noise} \quad (11)$$

The vectors p and s contain two structure parameters corresponding to an overlay parameter (the parameter of interest) and the height of the bottom grating 702A, 702B and the following are set:

$$s_1 = 0$$

$$s_2 = N(\Delta h, 1)$$

$$I'_{noise} = \sim N(0, 10^{-4})$$

Figure 8A:
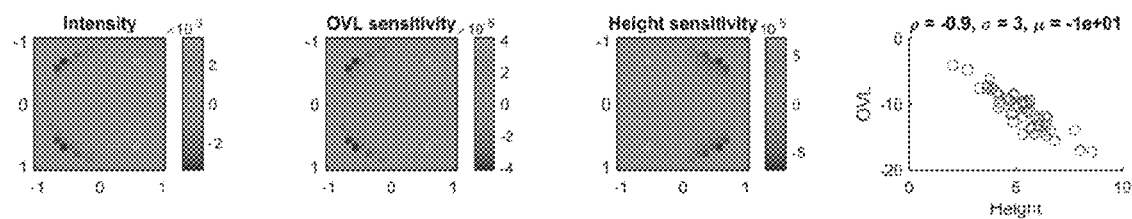
FIGS. 8A, 8B and 8C show a comparison of results obtained using different methods and apparatuses.
Figure 8B:
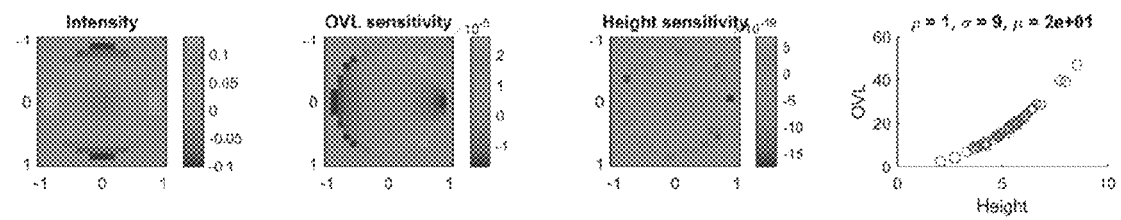
Figure 8C:
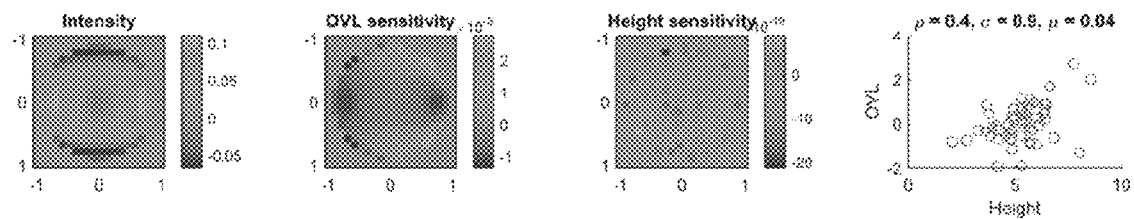

FIGS. 8A to 8C show the post-processed pupil representations, sensitivities, and scatter plots of height of the bottom grating 702A, 702B against overlay for a given distribution of the nuisance parameter $s_2$ (height). FIG. 8A relates to a differential pupil method described above, FIG. 8B relates to the first nuisance matrix and FIG. 8C relates to the second nuisance matrix. The second nuisance matrix only comprises two derivatives from the Taylor series expansion (5) and already shows a considerable improvement with respect to the differential filter, as can be seen from the scatter plots. The correlation p between height of the bottom grating 702A, 702B and the overlay decreases by a factor of two, the standard deviation a decreases by a factor of 3 and the bias p almost reduces to zero. The results can be improved by incorporating more derivatives of the terms of the Taylor series expansion (5) into the nuisance matrix D.

Figure 9:
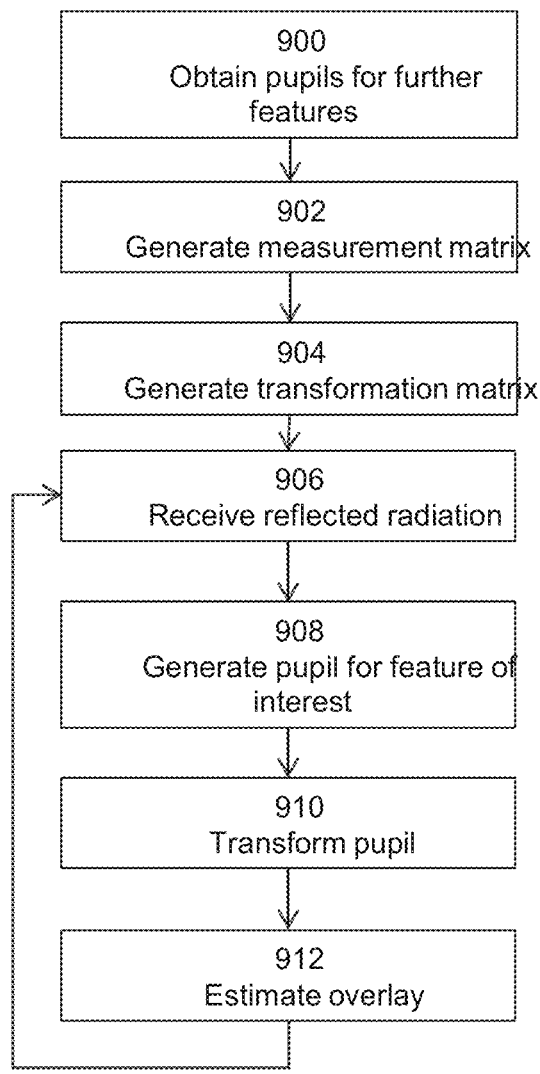
FIG. 9 is a flow chart showing a method for estimation of a parameter of interest.

FIG. 9 shows a flow diagram of an exemplary method for estimating a parameter of interest.

Figure 10:
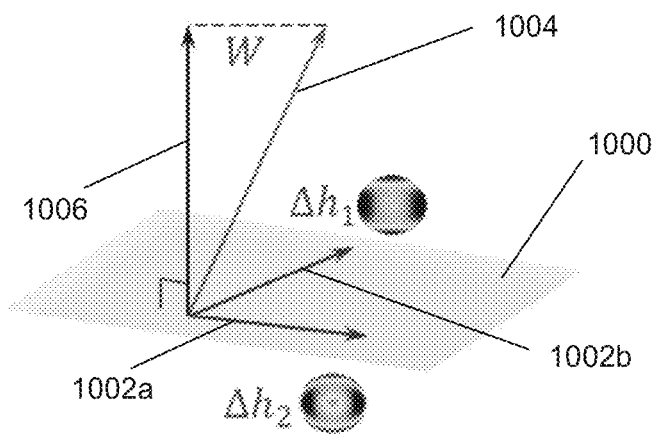
FIG. 10 is a geometric representation of a plurality of vectors corresponding to nuisance parameters and a transformation matrix.

The method described above in respect of FIG. 6 can be thought of as a process for filtering a pupil image for a feature of interest to mitigate or remove contributions caused by one or more nuisance parameters. This filtering approach may be represented geometrically, as shown in FIG. 10, which shows a hyperplane 1000 in which vectors 1002a, 1002b representing the nuisance parameters are projected. The transformation matrix, which is represented by the vector 1004, projects the contribution of the overlay to the pupil image for the feature of interest onto a direction 1006 that is orthogonal to the hyperplane 1000. This orthogonality allows isolation of the overlay term using the singular value decomposition.

The process of FIG. 6 involves calculation of the transformation matrix based on knowledge of the nominal feature or stack model. Such knowledge is not always accurate or reliable. As disclosed with reference to FIG. 9, the transformation matrix may be determined based on measurements of a plurality of further features and specifically based on pupil images for a plurality of further features.

Exemplary methods and apparatuses are configured to obtain 900 measured pupil representations for a plurality of further features other than the feature of interest and that are fabricated on the substrate. This process may be undertaken by the lithographic apparatus LA of FIG. 1. The further features exhibit parameters and that means the measured pupil representations may be represented by vectors all lying in the same plane, which is analogous to the hyperplane 1000 of FIG. 10. In exemplary methods and apparatuses, the further features that are irradiated in order to capture the measured pupil representations may exhibit one or both of the following properties:

The nuisance parameters of the features vary randomly by feature, which may be as a result of process variation associated with the fabrication of the further features; and/or The variation in the parameter of interest (in this case overlay) is below a threshold value or is known.

With regard to the variation of the parameter of interest, the threshold value may be such that the contribution to a measured pupil representation because of the parameter of interest (e.g. overlay variation) is at least one order of magnitude smaller than the contributions to the measured pupil representation because of one or more of the nuisance parameters. In some exemplary methods and apparatuses, the parameter of interest (e.g. overlay) may be known by, for example, determination by a reference method such as decapping plus SEM, cross section SEM or an alternative method.

Based on the measured pupil representations of the further features, the measurement matrix generator 522 is configured to generate 902 a measurement matrix. This may be done by reformatting each of the measured pupil representations into a vector and each of those vectors forming a column of the measurement matrix. In exemplary methods and apparatuses, the measurement matrix generator 522 may remove an average pupil representation from the plurality of measured pupil representations before generating the measurement matrix. This may be done using the following equation:

$$\hat{I}_k = I_k - \frac{1}{N}\sum_{n=1}^{N} I_n \quad k = 1, \ldots, N$$

where I is a measured pupil representation, $\hat{I}$ is the measured pupil representation after removal of the average pupil representation and N is the number of measurements.

The measurement matrix, M, may then be determined by $M=[\hat{I}_1, \hat{I}_2, \hat{I}_3, \ldots \hat{I}_N]$.

When the measured pupil representations meet the criteria set out above (or other corresponding criteria) it can be shown that vectors representing the measured pupils will lie in the same hyperplane 1000 of FIG. 10 as the vectors 1002a, 1002b. It is therefore possible to determine the hyperplane 1000 based on the measurement matrix. The determined hyperplane 1000 may then be used to generate 904 the transformation matrix W. This may be done by solving the system WM=0, W≠0 using the SVD as detailed above in respect of the process disclosed in FIG. 6. The remaining steps 906-912 of the process of FIG. 9 are the same or similar, mutatis mutandis, to the corresponding steps of FIG. 6.

Figure 11:
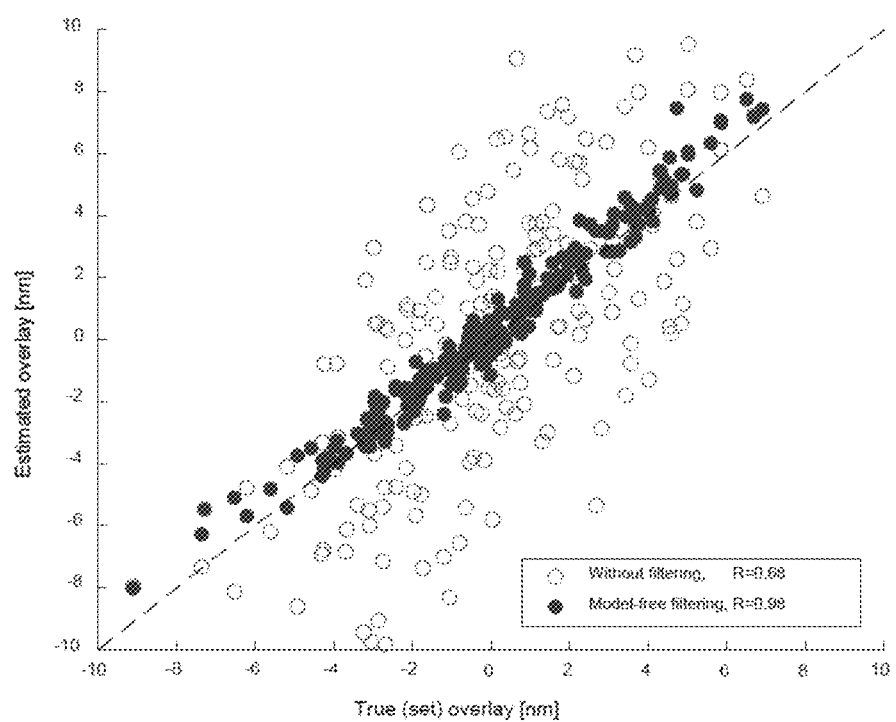
FIG. 11 shows a plot of estimated overlay against true overlay with and without use of the method of FIG. 9.

In order to demonstrate the performance of the method of FIG. 9, a simple stack (or feature) may be considered. First, a filter is generated by building the matrix M with measurements corresponding to random variations in structure parameters such as: height of top grating, height of bottom grating and asymmetry of top grating. The standard deviation for these parameters is chosen to be 0.5% of their nominal value. In the example described herein, the overlay (the parameter of interest in this example) does not vary. Secondly, a set-get experiment is performed. A known value is set for overlay, random variation is added to the nuisance parameters (with standard deviation of 0.5% of nominal value, as before), random noise is added to the pupil (with standard deviation of 10-3), and an estimated overlay is determined from this pupil. FIG. 11 shows a plot of estimated overlay against true overlay both with and without using the method of FIG. 9 (R is the correlation coefficient between the two quantities and should ideally be 1). If the estimated overlay is close to the true overlay then the points lie close to the line y=x and the correlation coefficient R is close to 1. As can be seen from FIG. 11, the method of FIG. 9 (model-free filtering) shows much better correlation than without the process of FIG. 9 (without filtering).

A computer program may be configured to provide any of the above described methods. The computer program may be provided on a computer readable medium. The computer program may be a computer program product. The product may comprise a non-transitory computer usable storage medium. The computer program product may have computer-readable program code embodied in the medium configured to perform the method. The computer program product may be configured to cause at least one processor to perform some or all of the method.

Various methods and apparatuses are described herein with reference to block diagrams or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

Computer program instructions may also be stored in a computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-ray).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks.

Accordingly, an embodiment of the invention may be embodied in hardware and/or in software (including firmware, resident software, micro-code, etc.) that runs on a processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated.

Further embodiments are described in below numbered clauses:

1. An apparatus for estimation of at least one parameter of interest of a feature fabricated on a substrate, the feature comprising a plurality of structure parameters, the structure parameters comprising the at least one parameter of interest and one or more nuisance parameters, the apparatus comprising:
   a nuisance matrix generator configured to generate a nuisance matrix comprising one or more elements corresponding to one or more of the nuisance parameters;
   a transformation matrix generator configured to generate a transformation matrix based on the nuisance matrix;
   a receiver configured to receive radiation scattered from one or more measured features on the substrate;
   a pupil generator configured to generate an unprocessed pupil representation of the received radiation, the unprocessed pupil representation comprising a plurality of pixels each having an intensity indicative of the at least one parameter of interest and the one or more nuisance parameters;
   a matrix multiplier for multiplying the transformation matrix with the intensities of each of the pixels of the unprocessed pupil representation to determine a post-processed pupil representation in which the effects of the nuisance parameters are mitigated or removed; and
   a parameter estimator configured to estimate the at least one parameter of interest based on the post-processed pupil representation.
2. An apparatus according to clause 1, wherein the at least one parameter of interest comprises overlay between at least two elements of the one or more measured features on the substrate, in at least one axis.
3. An apparatus according to clause 1 or 2, wherein the nuisance matrix generator is configured to determine the elements of the nuisance matrix based on one or more terms of a mathematical representation of a function describing the unprocessed pupil representation, and wherein the mathematical representation separates at least one of the nuisance parameters from the at least one parameter of interest,
4. An apparatus according to clause 3, wherein the function describing the unprocessed pupil representation is I'(p+s), and wherein:
   p is a vector of the plurality of structure parameters of a feature model corresponding to the one or more measured features;
   s is a vector of differences in the vector of parameters between the feature model and the one or more measured features; and
   I' is the unprocessed pupil representation.
5. An apparatus according to clause 3 or 4, wherein the nuisance matrix comprises terms of the mathematical representation corresponding to one or more of the separated nuisance parameters.
6. An apparatus according to any of clauses 3 to 5, wherein the mathematical representation comprises a Taylor series expansion of the function describing the unprocessed pupil representation.
7. An apparatus according to clause 6, wherein the nuisance matrix generator is configured to determine one or more of the elements of the nuisance matrix to be one or more derivative parts of one of one or more terms of the Taylor series expansion.
8. An apparatus according to any preceding clause, wherein the transformation matrix generator is configured to generate the transformation matrix by decomposing the nuisance matrix into a singular value decomposition, $USV^H$, thereof, such that $$WD = WUSV^H = W\Sigma_{k=1}^{np} s_k u_k v_k^H$$

where np is a number of columns of the nuisance matrix, and wherein the transformation matrix generator is configured to generate at least part of the transformation matrix based on a plurality of elements of the matrix U that are orthogonal to $u_k$ for k=1 to np.
9. An apparatus according to clause 8, wherein the transformation matrix generator is configured to generate the transformation matrix by undertaking a conjugate transpose of a plurality of elements of the matrix U that are orthogonal to $u_k$ for k=1 to np.
10. An apparatus according to any preceding clause, wherein the transformation matrix generator is configured to generate the transformation matrix that reduces a proportion of the intensity of the post-processed pupil representation caused by the one or more nuisance parameters.
11. An apparatus according to clause 10, wherein the proportion of the intensity of the post-processed pupil representation caused by the nuisance parameters is reduced by one of: greater than 50%; greater than 80%; and 100%.
12. An apparatus according to any of clauses 4 to 11 when dependent directly or indirectly on clause 3, wherein the transformation matrix generator is configured to generate a transformation matrix that produces a non-zero result when multiplied by a term of the function describing the unprocessed pupil representation corresponding to the at least one parameter of interest.
13. An apparatus according to clause 12, wherein the transformation matrix generator is configured to generate the transformation matrix that increases a ratio between a proportion of the intensity of the post-processed pupil representation caused by the at least one parameter of interest and the proportion of the intensity of the post-processed pupil representation caused by the nuisance parameters relating to the elements of the nuisance matrix when multiplied with the intensities of the pixels of the unprocessed pupil representation.
14. An apparatus according to clause 12, wherein the transformation matrix generator is configured to generate the transformation matrix that maximises the ratio between the proportion of the intensity of the post-processed pupil representation caused by the at least one parameter of interest and the proportion of the intensity of the post-processed pupil representation caused by the nuisance parameters relating to the elements of the nuisance matrix.

15. An inspection apparatus comprising the apparatus of any preceding clause, and further comprising a radiation source for irradiating the one or more features.
16. A method for estimation of at least one parameter of interest of a feature fabricated on a substrate, the feature comprising a plurality of structure parameters, the structure parameters comprising the at least one parameter of interest and one or more nuisance parameters, the method comprising:
generating, by a nuisance matrix generator, a nuisance matrix comprising one or more elements corresponding to one or more nuisance parameters;
generating, by a transformation matrix generator, a transformation matrix (W) based on the nuisance matrix;
receiving, by a receiver, radiation reflected from one or more measured features on the substrate;
generating, by a pupil generator, an unprocessed pupil representation based on the received radiation, the unprocessed pupil representation comprising a plurality of pixels each having an intensity indicative of the at least one parameter of interest and the one or more nuisance parameters;
multiplying, by a matrix multiplier, the transformation matrix with the intensities of each of the pixels of the unprocessed pupil representation to determine a post-processed pupil representation in which the effects of the nuisance parameters are mitigated; and
estimating, by a parameter estimator, the at least one parameter of interest based on the post-processed pupil representation.
17. A method according to clause 16, wherein the at least one parameter of interest comprises overlay between at least two elements of the one or more measured features on the substrate, in at least one axis,
18. A method according to clause 16 or 17, wherein the nuisance matrix generator determines the elements of the nuisance matrix based on one or more terms of a mathematical representation of a function describing the unprocessed pupil representation, and wherein the mathematical representation separates at least one of the nuisance parameters from the at least one parameter of interest,
19. A method according to clause 18, wherein the function describing the unprocessed pupil representation is I'(p+s), and wherein:
p is a vector of the plurality of structure parameters of a feature model corresponding to the one or more measured features;
s is a vector of differences in the vector of parameters between the feature model and the one or more measured features; and
I' is the unprocessed pupil representation.
20. A method according to clause 18 or 19, wherein the nuisance matrix comprises terms of the mathematical representation corresponding to one or more of the separated nuisance parameters.
21. A method according to any of clauses 18 to 20, wherein the mathematical representation comprises a Taylor series expansion of the function describing the unprocessed pupil representation.
22. A method according to clause 21, wherein the nuisance matrix generator determines one or more of the elements of the nuisance matrix to be one or more derivative parts of one of one or more terms of the Taylor series expansion.
23. A method according to any of clauses 16 to 22, wherein the transformation matrix generator generates the transformation matrix by decomposing the nuisance matrix into a singular value decomposition, $USV^H$, thereof, such that $$WD=WUSV^H=W\Sigma_{k=1}^{np}s_k u_k v_k^H$$

where np is a number of columns of the nuisance matrix, and wherein the transformation matrix generator generates at least part of the transformation matrix based on a plurality of elements of the matrix U that are orthogonal to $u_k$ for k=1 to np.
24. A method according to clause 23, wherein the transformation matrix generator generates the transformation matrix by undertaking a conjugate transpose of a plurality of elements of the matrix U that are orthogonal to $u_k$ for k=1 to np.
25. A method according to any of clauses 16 to 24, wherein the transformation matrix generator generates the transformation matrix that reduces a proportion of the intensity of the post-processed pupil representation caused by the one or more nuisance parameters.
26. A method according to clause 25, wherein the proportion of the intensity of the post-processed pupil representation caused by the nuisance parameters is reduced by one of: greater than 50%; greater than 80%; or 100%.
27. A method according to any of clauses 19 to 26 when dependent directly or indirectly on clause 18, wherein the transformation matrix generator generates a Transformation matrix that produces a non-zero result when multiplied by a term of the function describing the unprocessed pupil representation corresponding to the at least one parameter of interest.
28. A method according to clause 27, wherein the transformation matrix generator generates the transformation matrix that increases a ratio between a proportion of the intensity of the post-processed pupil representation caused by the at least one parameter of interest and the proportion of the intensity of the post-processed pupil representation caused by the nuisance parameters relating to the elements of the nuisance matrix when multiplied with the intensities of the pixels of the unprocessed pupil representation.
29. A method according to clause 28, wherein the transformation matrix generates the transformation matrix that maximises the ratio between the proportion of the intensity of the post-processed pupil representation caused by the at least one parameter of interest and the proportion of the intensity of the post-processed pupil representation caused by the nuisance parameters relating to the elements of the nuisance matrix.
30. A computer program comprising instructions which, when executed on at least one processor, cause the at least one processor to control an apparatus to carry out the method according to any of clauses 16 to 29.
31. A carrier containing the computer program of clause 30, wherein the carrier is one of an electronic signal, optical signal, radio signal, or non-transitory computer readable storage medium.
32. An apparatus for estimation of at least one parameter of interest of a feature fabricated on a substrate, the feature comprising a plurality of structure parameters, the structure parameters comprising the at least one parameter of interest and one or more nuisance parameters, the apparatus comprising:

a receiver configured to receive radiation scattered from one or more measured features on the substrate;

a pupil generator configured to generate an unprocessed pupil representation of the received radiation, the unprocessed pupil representation comprising a plurality of pixels each having an intensity indicative of the at least one parameter of interest and the one or more nuisance parameters;

a matrix multiplier for multiplying a transformation matrix with the intensities of each of the pixels of an unprocessed pupil representation of the feature to determine a post-processed pupil representation in which the effects of the nuisance parameters are mitigated or removed; and a parameter estimator configured to estimate the at least one parameter of interest based on the post-processed pupil representation.

33. An apparatus according to clause 32, wherein the at least one parameter of interest comprises overlay between at least two elements of the one or more measured features on the substrate, in at least one axis.

34. An apparatus according to clause 32 or 33, further comprising a transformation matrix generator configured to generate a transformation matrix based on one or more of the nuisance parameters.

35. An apparatus according to clause 34, further comprising a nuisance matrix generator configured to generate a nuisance matrix comprising one or more elements corresponding to one or more of the nuisance parameters, wherein the transformation matrix is generated based on the nuisance matrix.

36. An apparatus according to clause 35, wherein the nuisance matrix generator is configured to determine the elements of the nuisance matrix based on one or more terms of a mathematical representation of a function describing the unprocessed pupil representation, and wherein the mathematical representation separates at least one of the nuisance parameters from the at least one parameter of interest.

37. An apparatus according to clause 36, wherein the function describing the unprocessed pupil representation is I'(p+s), and wherein:

p is a vector of the plurality of structure parameters of a feature model corresponding to the one or more measured features;

s is a vector of differences in the vector of parameters between the feature model and the one or more measured features; and I' is the unprocessed pupil representation.

38. An apparatus according to clause 36 or 37, wherein the nuisance matrix comprises terms of the mathematical representation corresponding to one or more of the separated nuisance parameters.

39. An apparatus according to any of clauses 36 to 38, wherein the mathematical representation comprises a Taylor series expansion of the function describing the unprocessed pupil representation.

40. An apparatus according to clause 39, wherein the nuisance matrix generator is configured to determine one or more of the elements of the nuisance matrix to be one or more derivative parts of one of one or more terms of the Taylor series expansion.

41. An apparatus according to any of clauses 34 to 40, wherein the transformation matrix generator is configured to generate a transformation matrix that produces a non-zero result when multiplied by a term of the function describing the unprocessed pupil representation of the feature.

42. An apparatus according to clause 41, wherein the transformation matrix generator is configured to generate the transformation matrix that increases a ratio between a proportion of the intensity of the post-processed pupil representation caused by the at least one parameter of interest and the proportion of the intensity of the post-processed pupil representation caused by the nuisance parameters relating to the elements of the nuisance matrix when multiplied with the intensities of the pixels of the unprocessed pupil representation.

43. An apparatus according to clause 41, wherein the transformation matrix generator is configured to generate the transformation matrix that maximises the ratio between the proportion of the intensity of the post-processed pupil representation caused by the at least one parameter of interest and the proportion of the intensity of the post-processed pupil representation caused by the nuisance parameters relating to the elements of the nuisance matrix.

44. An apparatus according to clause 32, further comprising a transformation matrix generator configured to generate a transformation matrix based on a plurality of unprocessed pupil representations of a plurality of further features fabricated on the substrate.

45. An apparatus according to clause 44, wherein the plurality of further features fabricated on the substrate exhibit structure parameters resulting in pupil representations that are orthogonal to the transformation matrix.

46. An apparatus according to clause 45, wherein the exhibited structure parameters comprise randomly varying nuisance parameters and/or a variation in the parameter of interest that is less than a threshold value.

47. An apparatus according to clause 45 or 46, further comprising a measurement matrix generator configured to generate a measurement matrix comprising one or more of the plurality of unprocessed pupil representations of the plurality of further features fabricated on the substrate.

48. An apparatus according to clause 47, wherein, prior to generating the measurement matrix, the measurement matrix generator is configured to remove an average unprocessed pupil representation from the one or more unprocessed pupil representations of the plurality of further features fabricated on the substrate.

49. An apparatus according to any of clauses 33 to 48, wherein the transformation matrix generator is configured to generate the transformation matrix by decomposing the nuisance matrix or measurement matrix into a singular value decomposition, $USV^H$, thereof, such that $$WD = WUSV^H = W\sum_{k=1}^{np} s_k u_k v_k^H$$

where np is a number of columns of the nuisance matrix or measurement matrix, and wherein the transformation matrix generator is configured to generate at least part of the transformation matrix based on a plurality of elements of the matrix U that are orthogonal to $u_k$ for k=1 to np.

50. An apparatus according to clause 49, wherein the transformation matrix generator is configured to generate the transformation matrix by undertaking a conjugate transpose of a plurality of elements of the matrix U that are orthogonal to $u_k$ for k=1 to np.

51. An apparatus according to any of clauses 34 to 50 wherein the transformation matrix generator is configured to generate the transformation matrix that reduces a proportion of the intensity of the post-processed pupil representation caused by the one or more nuisance parameters.

52. An apparatus according to clause 51, wherein the proportion of the intensity of the post-processed pupil representation caused by the nuisance parameters is reduced by one of: greater than 50%; greater than 80%; or 100%.

53. An inspection apparatus comprising the apparatus of any clauses 32 to 52, and further comprising a radiation source for irradiating the one or more features.

The skilled person will be able to envisage other embodiments without departing from the scope of the appended claims.

The invention claimed is:

1. An apparatus for estimation of at least one parameter of interest of a feature fabricated on a substrate, the feature having a plurality of structure parameters, the structure parameters comprising the at least one parameter of interest and one or more nuisance parameters, the apparatus comprising:
   a receiver configured to receive radiation scattered from one or more measured features on the substrate;
   a pupil generator configured to generate an unprocessed pupil representation of the received radiation, the unprocessed pupil representation comprising a plurality of pixels each having an intensity indicative of the at least one parameter of interest and the one or more nuisance parameters;
   a matrix multiplier configured to multiply a transformation matrix with the intensities of each of the plurality of pixels of the unprocessed pupil representation to determine a post-processed pupil representation in which effects of the one or more nuisance parameters are mitigated or removed; and
   a parameter estimator configured to estimate the at least one parameter of interest based on the post-processed pupil representation.

2. The apparatus according to claim 1, wherein the at least one parameter of interest comprises overlay between at least two elements of the one or more measured features on the substrate, in at least one axis.

3. The apparatus according to claim 1, further comprising:
   a nuisance matrix generator configured to generate a nuisance matrix comprising one or more elements corresponding to one or more of the nuisance parameters; and
   a transformation matrix generator configured to generate a transformation matrix based on the nuisance matrix.

4. The apparatus according to claim 3, wherein the nuisance matrix generator is configured to determine elements of the nuisance matrix based on one or more terms of a mathematical representation of a function describing the unprocessed pupil representation, and
   wherein the mathematical representation separates at least one of the nuisance parameters from the at least one parameter of interest.

5. The apparatus according to claim 4, wherein the function describing the unprocessed pupil representation is I'(p+s), and wherein:
   p is a vector of the plurality of structure parameters of a feature model corresponding to the one or more measured features;
   s is a vector of differences in the vector of parameters between the feature model and the one or more measured features; and
   I' is the unprocessed pupil representation.

6. The apparatus according to claim 4, wherein the nuisance matrix comprises terms of the mathematical representation corresponding to one or more separated nuisance parameters.

7. The apparatus according to claim 4, wherein the mathematical representation comprises a Taylor series expansion of the function describing the unprocessed pupil representation.

8. The apparatus according to claim 7, wherein the nuisance matrix generator is configured to determine one or more of the elements of the nuisance matrix to be one or more derivative parts of one of one or more terms of the Taylor series expansion.

9. The apparatus according to claim 3, wherein the transformation matrix generator is configured to generate the transformation matrix by decomposing the nuisance matrix into a singular value decomposition, $USV^H$, thereof, such that $$WD = WUSV^H = W\Sigma_{k=1}^{np} s_k u_k v_k^H$$

where np is a number of columns of the nuisance matrix,
   and wherein the transformation matrix generator is configured to generate at least part of the transformation matrix based on a plurality of elements of the matrix U that are orthogonal to $u_k$ for k=1 to np.

10. The apparatus according to claim 9, wherein the transformation matrix generator is configured to generate the transformation matrix by undertaking a conjugate transpose of a plurality of elements of the matrix U that are orthogonal to $u_k$ for k=1 to np.

11. The apparatus according to claim 3, wherein the transformation matrix generator is configured to generate the transformation matrix that reduces a proportion of the intensity of the post-processed pupil representation caused by the one or more nuisance parameters.

12. The apparatus according to claim 11, wherein the proportion of the intensity of the post-processed pupil representation caused by the one or more nuisance parameters is reduced by greater than 50%, by greater than 80% or by 100%.

13. The apparatus according to claim 5, wherein the transformation matrix generator is configured to generate a transformation matrix that produces a non-zero result when multiplied by a term of the function describing the unprocessed pupil representation corresponding to the at least one parameter of interest.

14. The apparatus according to claim 13, wherein the transformation matrix generator is configured to generate the transformation matrix that increases a ratio between a proportion of the intensity of the post-processed pupil representation caused by the at least one parameter of interest and a proportion of the intensity of the post-processed pupil representation caused by the one or more nuisance parameters relating to the elements of the nuisance matrix when multiplied with the intensities of the plurality of pixels of the unprocessed pupil representation.

15. The apparatus according to claim 13, wherein the transformation matrix generator is configured to generate the transformation matrix that maximizes a ratio between a proportion of the intensity of the post-processed pupil representation caused by the at least one parameter of interest and a proportion of the intensity of the post-processed pupil representation caused by the one or more nuisance parameters relating to the elements of the nuisance matrix.

16. An inspection apparatus comprising the apparatus of claim 1, and further comprising a radiation source configured irradiate the one or more features.

17. A method comprising:
   receiving, by a receiver, radiation scattered from one or more measured features on the substrate;
   generating, by a pupil generator, an unprocessed pupil representation based on the received radiation, the unprocessed pupil representation comprising a plurality of pixels each having an intensity indicative of at least one parameter of interest of a feature fabricated on a substrate and of one or more nuisance parameters of the feature;
   multiplying, by a matrix multiplier, a transformation matrix with the intensities of each of the plurality of pixels of the unprocessed pupil representation to determine a post-processed pupil representation in which the effects of the one or more nuisance parameters are mitigated; and
   estimating, by a parameter estimator, the at least one parameter of interest based on the post-processed pupil representation.

18. The method according to claim 17, wherein the at least one parameter of interest comprises overlay between at least two elements of the one or more measured features on the substrate, in at least one axis.

19. A non-transitory computer readable medium comprising instructions, that when executed by a computer system, are configured to cause the computer to at least:
   generate an unprocessed pupil representation based on signals representing measured radiation scattered from one or more measured features on a substrate, the unprocessed pupil representation comprising a plurality of pixels each having an intensity indicative of at least one parameter of interest of a feature fabricated on a substrate and of one or more nuisance parameters of the feature;
   multiply a transformation matrix with the intensities of each of the plurality of pixels of the unprocessed pupil representation to determine a post-processed pupil representation in which the effects of the one or more nuisance parameters are mitigated; and
   estimate the at least one parameter of interest based on the post-processed pupil representation.

20. The computer readable medium according to claim 19, wherein the at least one parameter of interest comprises overlay between at least two elements of the one or more measured features on the substrate, in at least one axis.

* * * * *